US008085109B2

(12) United States Patent
Afshari et al.

(10) Patent No.: US 8,085,109 B2
(45) Date of Patent: Dec. 27, 2011

(54) ELECTRICAL FUNNEL: A NOVEL BROADBAND SIGNAL COMBINING METHOD

(75) Inventors: Ehsan Afshari, Newfield, NY (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 1358 days.

(21) Appl. No.: 11/525,682

(22) Filed: Sep. 22, 2006

(65) Prior Publication Data

US 2007/0086786 A1 Apr. 19, 2007

Related U.S. Application Data

(60) Provisional application No. 60/720,112, filed on Sep. 23, 2005, provisional application No. 60/815,215, filed on Jun. 20, 2006.

(51) Int. Cl.
*H01P 5/04* (2006.01)
*H03H 7/32* (2006.01)

(52) U.S. Cl. .......................... 333/24 R; 333/138; 703/6

(58) Field of Classification Search ................. 333/99 S, 333/202, 100, 24 R, 124–128, 136, 138; 703/6
See application file for complete search history.

(56) References Cited

U.S. PATENT DOCUMENTS 6,557,154 B1 * 4/2003 Harada et al. .................. 716/11
6,628,242 B1 * 9/2003 Hacker et al. ................. 343/909
7,456,704 B2 * 11/2008 Afshari et al. ................ 333/124
7,671,702 B2 * 3/2010 Afshari et al. ................ 333/124

* cited by examiner

*Primary Examiner* — Robert Pascal
*Assistant Examiner* — Alan Wong
(74) *Attorney, Agent, or Firm* — Milstein Zhang & Wu LLC; Joseph B. Milstein

(57) ABSTRACT

An electrical signal transformation device configured for emulation of physical, for example, optical, phenomena and/or a mathematical or logical process. The device employs a first plurality, second plurality and third plurality of electrical components each having a first terminal and a second terminal. The first plurality and second plurality of electrical components are arranged along a first direction and a second direction respectively, to form a planar two dimensional lattice. The first plurality of electrical components are configured to provide at least one of a constant signal propagation velocity and/or amplitude while the second plurality of electrical components are configured to provide at least one of a varying signal propagation velocity and/or amplitude. The lattice includes at least two input signal nodes and at least one output signal node and is configured to transform and communicate a plurality of input signals from the input node to the output node.

18 Claims, 20 Drawing Sheets

ELECTRICAL FUNNEL: A NOVEL BROADBAND SIGNAL COMBINING METHOD

CROSS-REFERENCE TO RELATED APPLICATIONS

This application claims priority to and the benefit of U.S. provisional patent application Ser. No. 60/720,112, filed Sep. 23, 2005, and claims priority to and the benefit of U.S. provisional patent application Ser. No. 60/815,215, filed Jun. 20, 2006, the disclosure of each of which is incorporated herein by reference in its entirety.

FIELD OF THE INVENTION

The invention generally relates to an electronic signal transformation device, and in particular to an electronic signal transformation device that employs a two dimensional electrical lattice that provides a controlled propagation velocity on one direction and a different controlled propagation velocity profile and/or signal attenuation profile in another direction.

BACKGROUND OF THE INVENTION

Recently, there has been growing interest in using silicon-based integrated circuits at high microwave and millimeter wave frequencies. This high level of integration offered by silicon enables numerous new topologies and architectures for low-cost reliable SoC applications at microwave and millimeter wave bands, such as broadband wireless access (e.g., WiMax), vehicular radars at 24 GHz and 77 GHz, short range communications at 24 GHz and 60 GHz, and ultra narrow pulse generation for UWB radar.

Power generation and amplification is one of the major challenges at millimeter wave frequencies. This is particularly critical in silicon integrated circuits due to the limited transistor gain, efficiency, and breakdown on the active side and lower quality factor of the passive components due to ohmic and substrate losses.

Efficient power combining is especially beneficial in silicon where a large number of smaller power sources and/or amplifiers can generate large output power levels reliably. Most of the traditional power combining methods use either resonant circuits and are narrowband or employ broadband, but lossy, resistive networks.

One-dimensional LC ladders have been extensively studied before. A homogeneous 1-D LC ladder consists of identical LC blocks repeated multiple times and can support wave propagation. It can also be used for broadband delay generation and low ripple filtering. An inhomogeneous linear 1-D line can be used to introduce controlled amounts of dispersion to a signal.

SUMMARY OF THE INVENTION

We propose for the first time a new general class of two-dimensional passive propagation media that can be used for power combining among other applications. These media take advantage of wave propagation in an inhomogeneous 2-D electrical lattice. Using this approach we show a power amplifier capable of generating 125 mW at 85 GHz in silicon.

In one aspect, the invention relates to an electrical signal transformation device. The device comprises a planar two dimensional lattice having a first plurality of electrical paths comprising a first plurality of electrical components that are arranged along a first direction in a plane and a second plurality of electrical paths comprising a second plurality of electrical components that are arranged along a second direction in the plane, each of the electrical components having a first terminal and a second terminal; each electrical component of the first plurality of electrical components having at least one electrical terminal connected to an electrical terminal of at least one electrical component of the second plurality of electrical components; a third plurality of electrical components having first and second terminals that are electrically connected between at least some of the electrical terminals of the first and second pluralities of electrical components and a reference voltage source; at least two input signal nodes and an output signal node selected from the terminals of the first plurality of electrical elements, the at least two input signal nodes configured to accept input signals and the at least one output signal node configured to provide at least one output signal; the first plurality of electrical components and the third plurality of electrical components selected to provide at least one of a constant signal propagation velocity and a constant signal propagation amplitude for signals propagating along paths of the first plurality of electrical paths; and the second plurality of electrical components and the third plurality of electrical components selected to provide at least one of a signal propagation velocity and a signal propagation amplitude that varies for signals propagating along the second plurality of electrical paths. The electrical signal transformation device is configured to provide at the at least one output signal node an output signal corresponding to a transformation of the plurality of input signals.

In one embodiment, the first plurality of electrical components are inductors having substantially the same inductance, the second plurality of electrical components are inductors having inductances that vary, and the third plurality of electrical components are capacitors having capacitances. In one embodiment, the first, second and third pluralities of electrical components are configured for emulation of one or more aspects of a physical phenomenon using at least one real time analog input signal. In one embodiment, the physical phenomenon is an optical refraction phenomenon. In one embodiment, the first, second and third pluralities of electrical components are configured for emulation of one or more aspects of a mathematical process using at least one real time analog input signal. In one embodiment, the mathematical process is a mathematical transform. In one embodiment, the mathematical transform is a discrete Fourier transform.

In one embodiment, the first, second and third pluralities of electrical components are configured for combining a plurality real time analog input signals. In one embodiment, the planar two dimensional lattice comprises a plurality of planar two dimensional sub-lattices, each of the planar two dimensional sub-lattices comprising a distinct planar two dimensional lattice having a respective first plurality of electrical components and third plurality of electrical components selected to provide at least one of a constant signal propagation velocity and a constant signal propagation amplitude for signals propagating along paths of the first plurality of electrical paths; and a respective second plurality of electrical components and third plurality of electrical components selected to provide at least one of a signal propagation velocity that varies for signals propagating along paths of the second plurality of electrical paths and a signal propagation amplitude that varies for signals propagating along paths of the second plurality of electrical paths. In one embodiment, a first planar two dimensional sub-lattice is configured to emulate a first optical material having a first refractive index and a second planar two dimensional sub-lattice is configured to emulate a second optical material having a second refractive index. In one embodiment, the first plurality of electrical components are capacitors having substantially the same capacitance, the second plurality of electrical components are capacitors having capacitances that vary, and the third plurality of electrical components are inductors having inductances.

In another aspect, the invention features a method of transforming a signal. The method comprises the steps of providing an electrical signal transformation device, and providing a plurality of input signals to the at least two input signal nodes; and observing at the at least one output signal node an output signal corresponding to a transformation of the plurality of input signals. The electrical signal transformation device comprises a two dimensional lattice having a first plurality of electrical paths comprising a first plurality of electrical components that are arranged along a first direction in a plane and a second plurality of electrical paths comprising a second plurality of electrical components that are arranged along a second direction in the plane; each of the electrical components having a first terminal and a second terminal, each electrical component of the first plurality of electrical components having at least one electrical terminal connected to an electrical terminal of at least one electrical component of the second plurality of electrical components; a third plurality of electrical components having first and second terminals, the third plurality of electrical components electrically connected between at least some of the electrical terminals of the first and second pluralities of electrical components and a reference voltage source; at least two input signal nodes and at least one output signal node selected from the terminals of the first plurality of electrical elements, the at least two input signal nodes configured to accept input signals and the at least one output signal node configured to provide at least one output signal; the first plurality of electrical components and the third plurality of electrical components selected to provide at least one of a constant signal propagation velocity and a constant signal propagation amplitude for signals propagating along the first plurality of electrical paths; and the second plurality of electrical components and the third plurality of electrical components selected to provide at least one of a signal propagation velocity that varies and a signal propagation amplitude that varies for signals propagating along the second plurality of electrical paths.

In one embodiment, a second plurality of input signals are provided to the at least two input signal nodes at a time after the step of providing a first plurality of input signals to the at least two input signal nodes, and before the step of observing at least one output signal at the at least one output signal node, the at least one output signal corresponding to a transformation of the first plurality of input signals. In one embodiment, the first plurality of input signals are analog input signals. In one embodiment, a time interval between the step of providing a first plurality of input signals to the at least two input signal nodes and the step of observing at least one output signal at the at least one output signal node, the at least one output signal corresponding to a transformation of the first plurality of input signals is a propagation time of an analog signal through the electrical signal transformation device. In one embodiment, the input signals comprise sinusoids. In one embodiment, the input signals comprise exponential components. In one embodiment, the input signals comprise complex components. In one embodiment, the input signals comprise a plurality of substantially the same input signal. In one embodiment, the input signals comprise at least two different input signals.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Figure 1A:
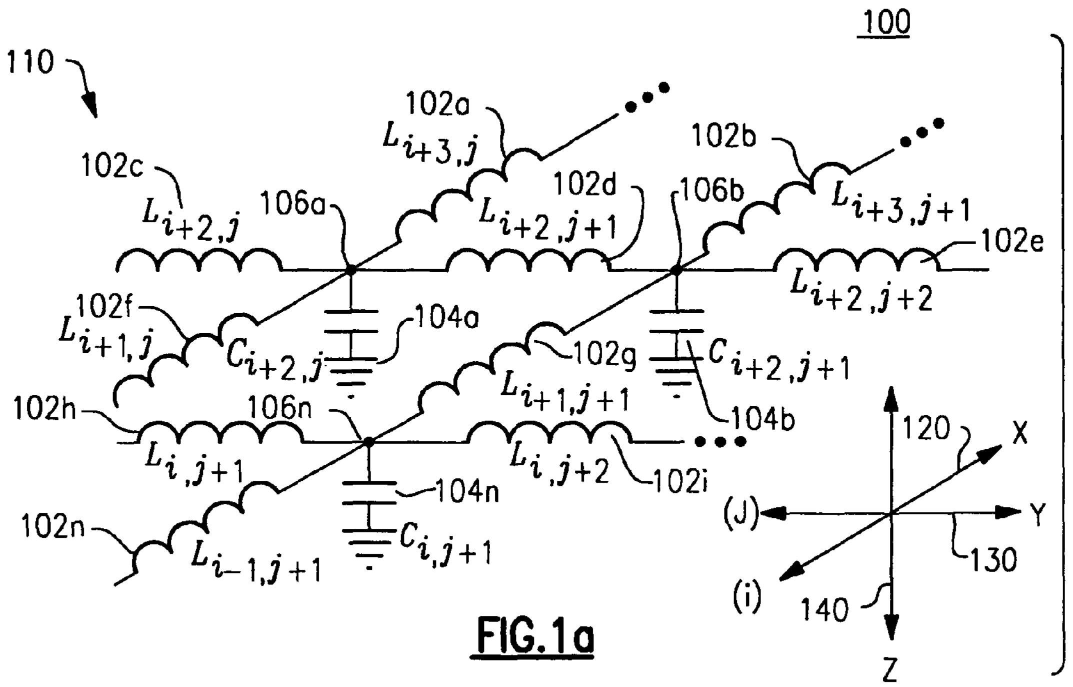
FIGS. 1A-1B illustrate an exemplary embodiment of a two dimensional electrical lattice in accordance with the invention.
Figure 1B:
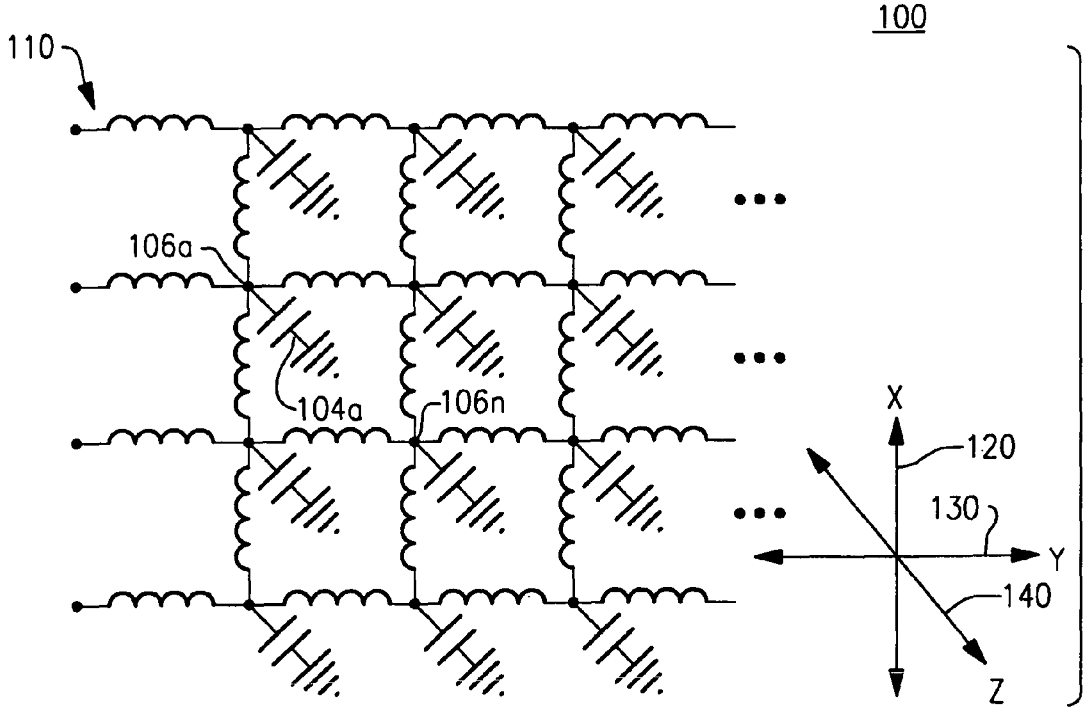

FIGS. 1A-1B illustrate an exemplary embodiment 100 of a two dimensional electrical lattice 110 in accordance with the invention. FIG. 1A illustrates a perspective view of a portion of the expanded lattice 110 of FIG. 1B. FIG. 1B illustrates a top-down view of the expanded lattice 110.

Referring to FIG. 1A, the portion of the lattice 110 includes separate inductors 102*a*-102*n*, capacitors 104*a*-104*n* and nodes 106*a*-106*n*. The inductors 102*a*-102*n* and capacitors 104*a*-104*n* are arranged proximate and electrically connected to the nodes 106*a*-106*n* of the lattice 110.

A first plurality of electrical components are located along a first plurality of electrical paths that are directed parallel to a first direction (such as an X axis) 120, also referred to as a first axis 120 or first direction 120, and are index identified using an (i) subscript. A second plurality of electrical components are located along a second plurality of electrical paths that are parallel to a second direction coplanar with the first direction (such as a Y axis) 130, also referred to as a second axis 130 or a second direction 130, and are index identified using an (j) subscript. The first direction and the second direction need not be oriented at 90 degrees to each other. For example, a surface can be completely covered using regular polygons including triangles, squares, and hexagons, and with many combinations of polygons that are not regular. An intersection between an electrical path that is parallel to the first direction 120 and between an electrical path that is parallel to the second direction 130 forms a node 106*a*-106*n* of the lattice 110. The lattice 110 is also referred to as a planar two-dimensional lattice 110.

The first plurality and second plurality of electrical components each have a first terminal and a second terminal and are shown as including the inductors 106*a*-106*n*. For example, inductors 102*a* and 102*f* are disposed along an electrical path that is directed parallel to the first axis 120 and inductors 102*c*, 102*d* and 102*e* are disposed along an electrical path that is directed parallel to the second axis 130. Each of the first plurality of electrical components has at least one terminal connected to a terminal of at least one component of the second plurality of electrical components.

A third plurality of electrical components, are located along a third plurality of electrical paths that are directed outside of (not parallel to) the plane formed by the intersection of the first plurality and second plurality of electrical paths. Each of the third plurality of electrical components also have a first and a second terminal and each have at least one terminal electrically connected in between at least some of the terminals of the first plurality and the second plurality of electrical components. In various embodiments, the first plurality, second plurality and third plurality of electrical components can include passive linear electrical components (or their equivalents), for example, inductors 102*a*-102*n*, capacitors 104*a*-104*n*, resistors, and active components that provide the equivalent electrical behavior as inductors, capacitors, or resistors.

The lattice 110 is designed to have at least at least two nodes that are selected as input signal nodes and that are configured to accept input signals. The input nodes are preferably selected from the terminals of the first plurality of electrical elements. A wide variety of input signals, including input signals that comprise sinusoids, exponential and complex components for example, can be selected for input into the lattice 110 via the input nodes. In some embodiments, the plurality of input signals comprise substantially the same input signal. In other embodiments, the plurality of input signals comprise at least two different input signals. In some embodiments, the plurality of input signals construct a plane wave that propagates through the lattice 110.

The lattice 110 is also designed to have at least one node, that is selected as an output signal node, and that is configured to provide a signal that has traveled at least partially through the lattice 110. The output node is preferably selected from the terminals of the first plurality of electrical elements. The lattice 110, functioning as part of an electrical signal transformation device, is configured to input, transform and output a plurality of input signals from the input signal nodes to the at least one output signal node.

In other embodiments, the arrangement of electrical components, including inductors and capacitors, can be supplemented with resistors and other linear components and/or their equivalents. In other embodiments, the arrangement of inductors and capacitors can be substituted with an arrangement of electrical components that constitute an dual circuit to that of the circuits described herein. In some embodiments, the lattice can include inductance capacitance (L-C) portions, inductance resistance (L-R) portions, and resistance capacitance (R-C) portions of circuitry in order to effectively transform different characteristic types of input signals. The dual circuit of a circuit described herein is also contemplated, as dual circuits are understood in general to provide complementary behavior, where the voltage and current signals of one are transformed into corresponding current and voltage signals of the other.

A 1-D (one dimensional) LC (inductance-capacitance) ladder can be generalized to a 2-D (two dimensional) propagation medium by forming a lattice consisting of inductors (L) 102*a*-102*n* and capacitors (C) 104*a*-104*n*. FIG. 1 shows a square lattice, but the arrangement of inductors 102*a*-102*n* and capacitors 104*a*-104 can also be applied to other types of lattice topologies including such as a rectangular, triangular or hexagonal lattice (not shown). Generally, this lattice can be inhomogeneous where the values of inductors and capacitors vary in space. When the values of the inductors and capacitors do not change too abruptly, it is possible to define local propagation delay ($\propto\sqrt{LC}$) and local characteristic impedances ($\propto\sqrt{L/C}$) at each node 106*a*-106*n*. This allows us to define local impedance and velocity as functions of first 120 and second 130 directions, which can be engineered to achieve the desired propagation and reflection properties. We consider a sub-class of these 2-D media where a plane-wave propagates along the first direction 120 (from left to right) in a rectangular medium.

Figure 2A:
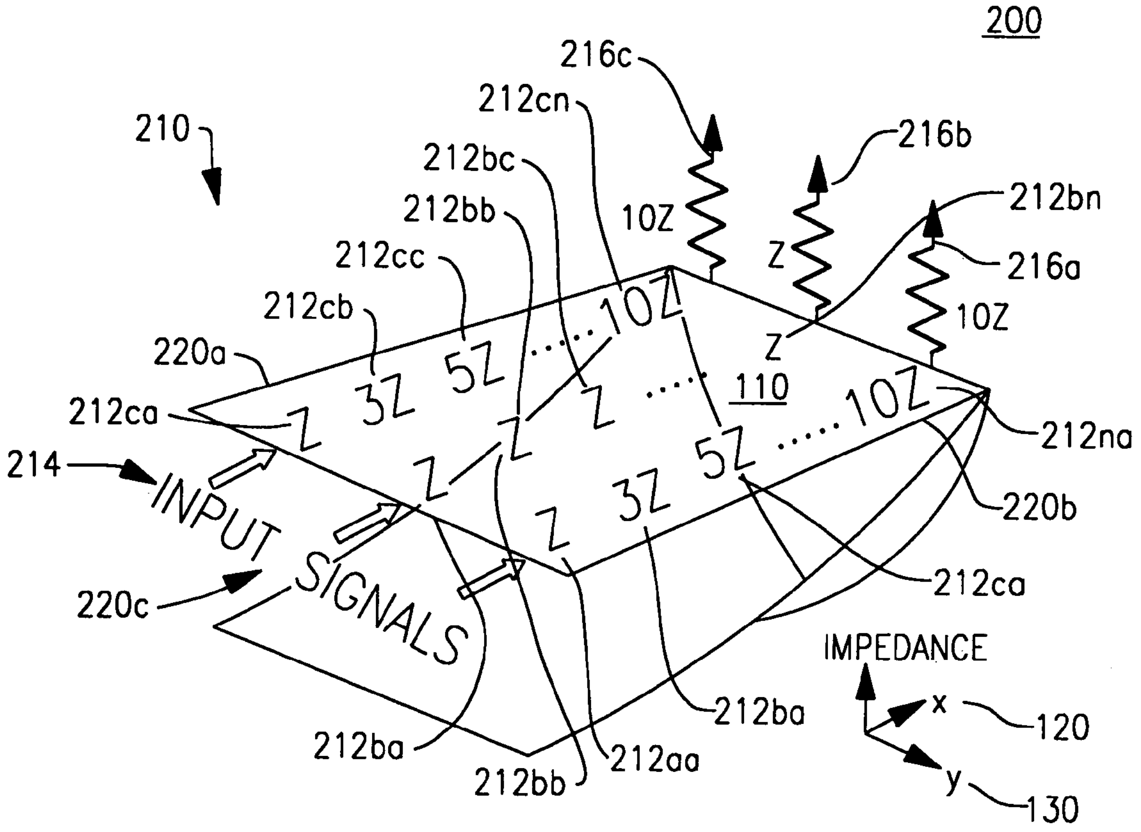
FIGS. 2A-2B illustrates exemplary arrangement of portions of the electrical lattice that are each assigned a separate electrical impedance in order to emulate an operation of an electrical funnel.
Figure 2B:
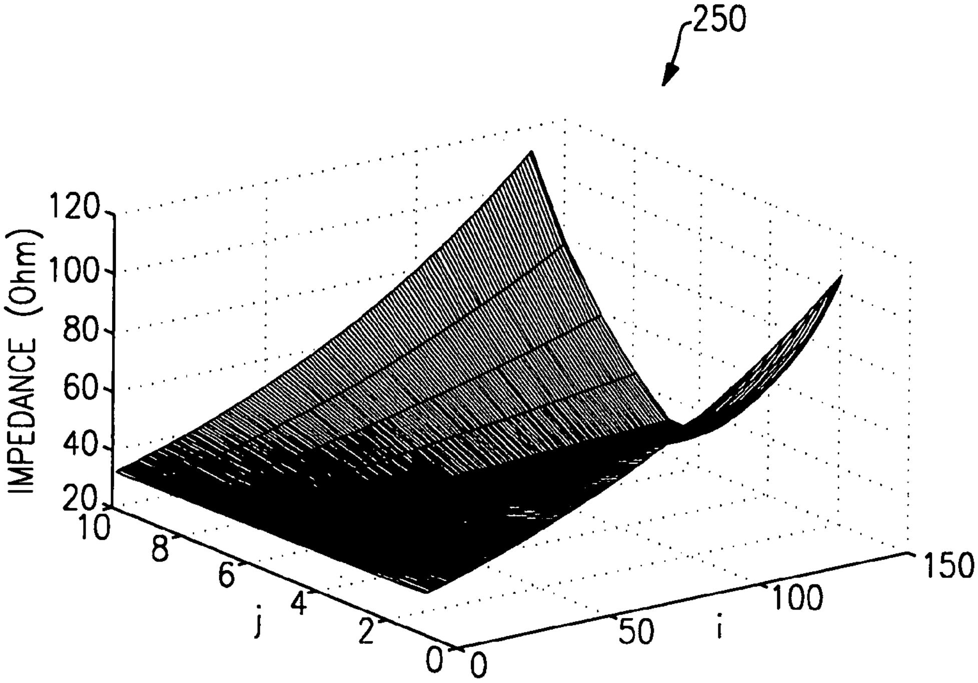

FIGS. 2A-2B illustrate an exemplary arrangement 210 of portions (regions/sub-lattices) of the electrical lattice 210 that are each assigned a separate electrical impedance in order to emulate an operation of an electrical funnel. FIG. 2A illustrates a distribution of impedance throughout the lattice 210 that is implemented as an electrical funnel 210. FIG. 2B illustrates a graphical representation 250 of the distribution of impedance.

In the embodiments shown in FIG. 2 and subsequent figures, a square lattice, with first and second directions oriented parallel to the X 120 and Y 130 axes, respectively, is used for ease of exposition. As shown, portions of the lattice 110 are assigned separate impedances to demonstrate a basic idea of a funnel. For example, portions 212*aa*, 212*ba*, 212*ca* through 212*na* are assigned impedance values of Z, 3Z, 5Z, . . . 10Z respectively, and portions 212*ba*, 212*bb* through 212*bn* are assigned impedance values of Z uniformly, and portions 212*ca*, 212*cb*, 212*cc* through 212*cn* are assigned impedance values Z, 3Z, 5Z, . . . 10Z respectively. Input signals 214 are input into the lattice 110 at input terminals not shown and are output from the lattice 110 at the output terminals 216*a*-216*c*.

One of the ways these surfaces can be engineered is by keeping the signal propagation velocity constant with respect to its X dimension 120 (constant LC product for a given X coordinate), while increasing the characteristic impedance with respect to its Y dimension 130 at the top 220*a* and bottom 220*b* of the lattice 110, as we move along the X axis 120 to the right. This is shown in FIG. 2 graphically. A planar wave propagating in the X direction 120 from left to right gradually experiences higher impedances at the top 220*a* and bottom 220*b* edges, while experiencing a relatively lower impedance (resistance) path for the current traveling in the middle (center) 220*c* of the lattice 110. This impedance profile funnels more power to the center 220*c* of the lattice 110, as the wave propagates to the right (towards the output nodes 216*a*-216*c*), as demonstrated in the simulated voltage and current waveforms shown in FIGS. 3A-3B.

By keeping the propagation velocity independent of the Y axis 130 as the signal propagates along the X axis 120 (towards the output nodes 216*a*-216*c*), the signal maintains a shape of a plane wave while keeping the lattice response frequency independent for the frequencies lower than its natural cut-off frequency. We call this an electrical funnel due to the way it combines and channels the power to the center 220*c* of the lattice 110 towards the output nodes 216*a*-216*c*.

Embodiments of the invention are preferably designed to satisfy criteria where the first plurality of electrical components and the third plurality of electrical components are selected to provide at least one of a constant signal propagation velocity and/or a constant signal propagation amplitude for signals propagating along the first plurality of electrical paths. The second plurality of electrical components and the third plurality of electrical components are preferably designed to provide at least one of a signal propagation velocity and/or a signal propagation amplitude that varies for signals propagating along the second plurality of electrical paths.

As shown in FIG. 1A. the first plurality of electrical paths include the inductors 102*c*-102*e*, 102*h*-102*i*. The second plurality of electrical paths include the inductors 102*a* and 102*f*, and inductors 102*b*, 102*g* and 102*n*. The third plurality of paths includes the capacitors 104*a*-104*n* which are located outside of the plane formed by the first and second plurality of electrical paths.

As will be further described, a signal propagation delay characteristic $T=\sqrt{LC}$, which is a function of the inductance and capacitance per unit length along an electrical path, affects the signal propagation velocity of a signal propagating (traveling) along the electrical path. An impedance characteristic $R=\sqrt{L/C}$, which is also a function of the inductance and capacitance per unit length along an electrical path, affects the signal amplitude, such as the signal current as a function of time, of a signal propagating (traveling) along the electrical path.

For example, in some embodiments, the first plurality of electrical components are inductors having substantially the same inductance, and the second plurality of electrical components are inductors having inductances that vary, and the third plurality of electrical components are capacitors having capacitances. The inductances that vary do so along the electrical paths that are parallel to the direction of the Y axis 130 and influence the signal propagation delay characteristic and/or the impedance characteristic of those electrical paths.

The lattice 110 is designed so that a signal is input via at least two input signal nodes and is transformed and communicated to at least one output signal node of the lattice 110. Further, the lattice is preferably designed so that both a first plurality and a second plurality of signals are input into the lattice 110 in sequence over time and before an output signal corresponding to a transformation of the first plurality of signals is observed via the at least one output signal node.

In some embodiments, the lattice 110 is also designed so that the first, second and third pluralities of electrical components are configured for emulation of one or more aspects of at least one physical phenomenon by inputting, transforming and outputting at least one real time analog input signal. In some embodiments, the physical phenomenon includes optical refraction or diffraction. In some embodiments, the first, second and third pluralities of electrical components are configured for emulation of one or more aspects of at least one logical process, such as a mathematical process. The mathematical process can be a mathematical transform, such as a discrete Fourier transform. In some embodiments, the first, second and third pluralities of electrical components are configured for combining a plurality of real time analog input signals.

In some embodiments, the lattice 110 comprises a plurality of planar two dimensional sub-lattices. The two dimensional sub-lattices can be defined as portions of the lattice 110, and are also referred to as portions or regions of the lattice 110. Each of the sub-lattices comprises a distinct planar two dimensional lattice having a respective first plurality and third plurality of electrical components that are selected to provide at least one of a constant signal propagation velocity and/or a constant signal propagation amplitude for signals propagating along the first plurality of electrical paths, and a respective second plurality and third plurality of electrical components selected to provide at least one of a signal propagation velocity and/or a signal propagation amplitude that varies for signals propagating along the second plurality of electrical paths.

In some embodiments, a first planar two dimensional sub-lattice is configured to emulate a first optical material having a first refractive index and a second planar two dimensional sub-lattice is configured to emulate a second optical material having a second refractive index.

Figure 3A:
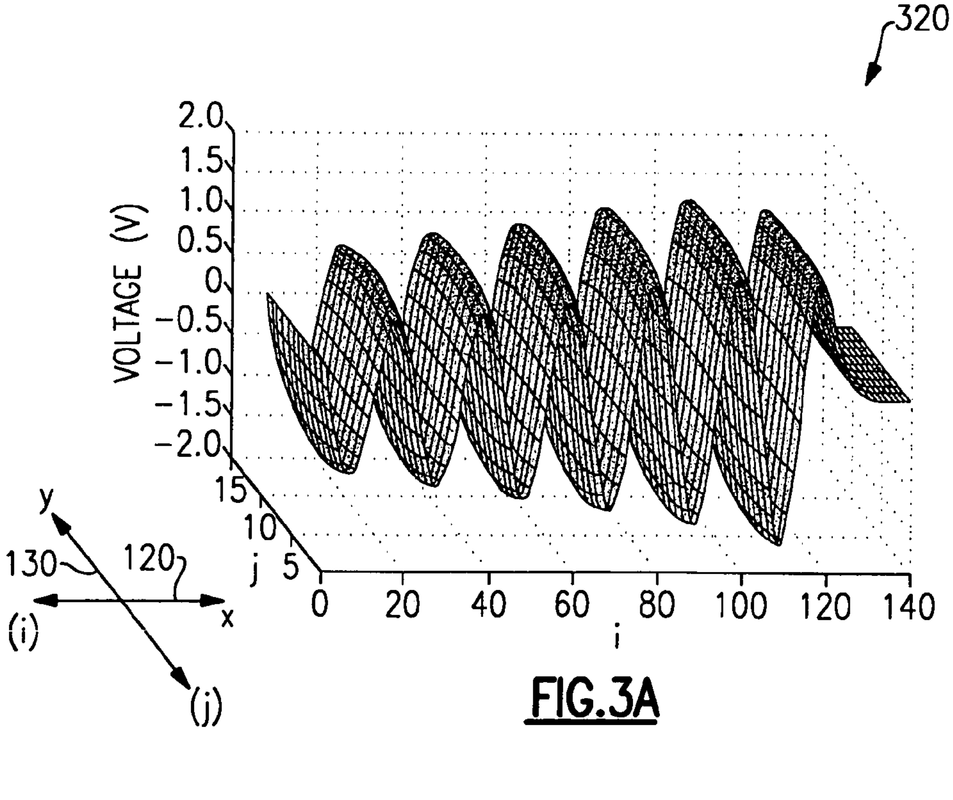
FIGS. 3A-3D illustrate results of emulating an ideal electrical funnel using an embodiment of the invention.
Figure 3B:
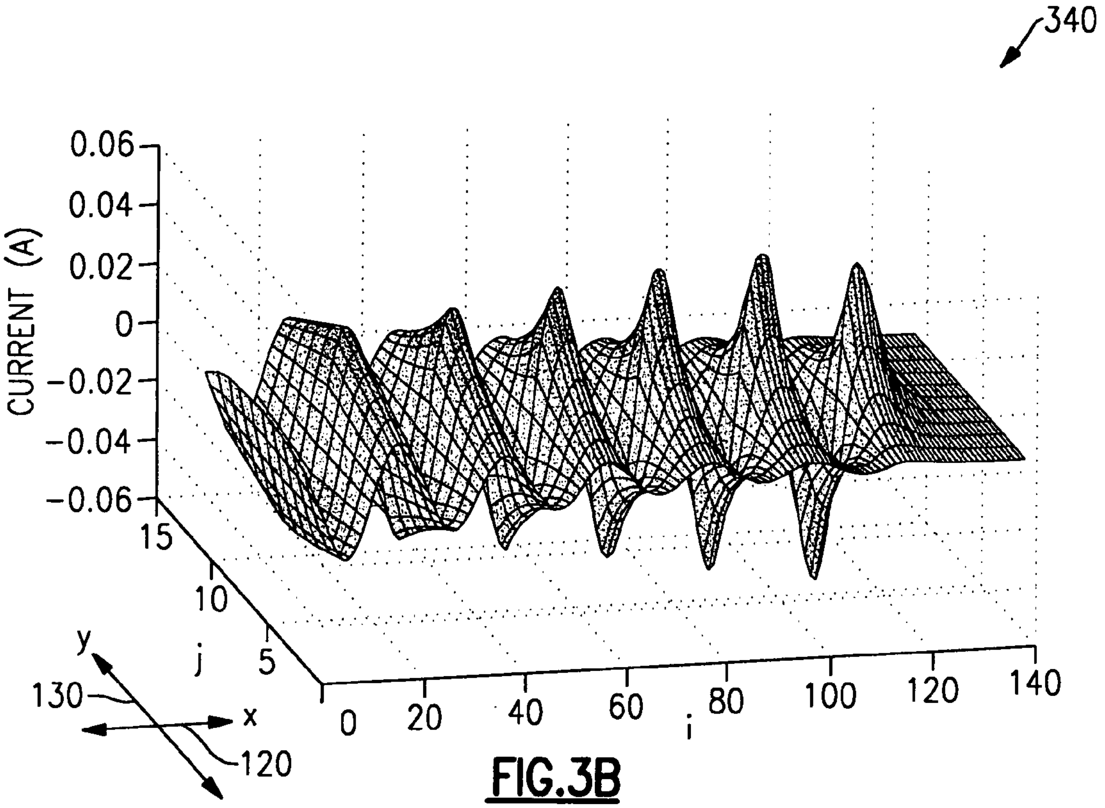
Figure 3C:
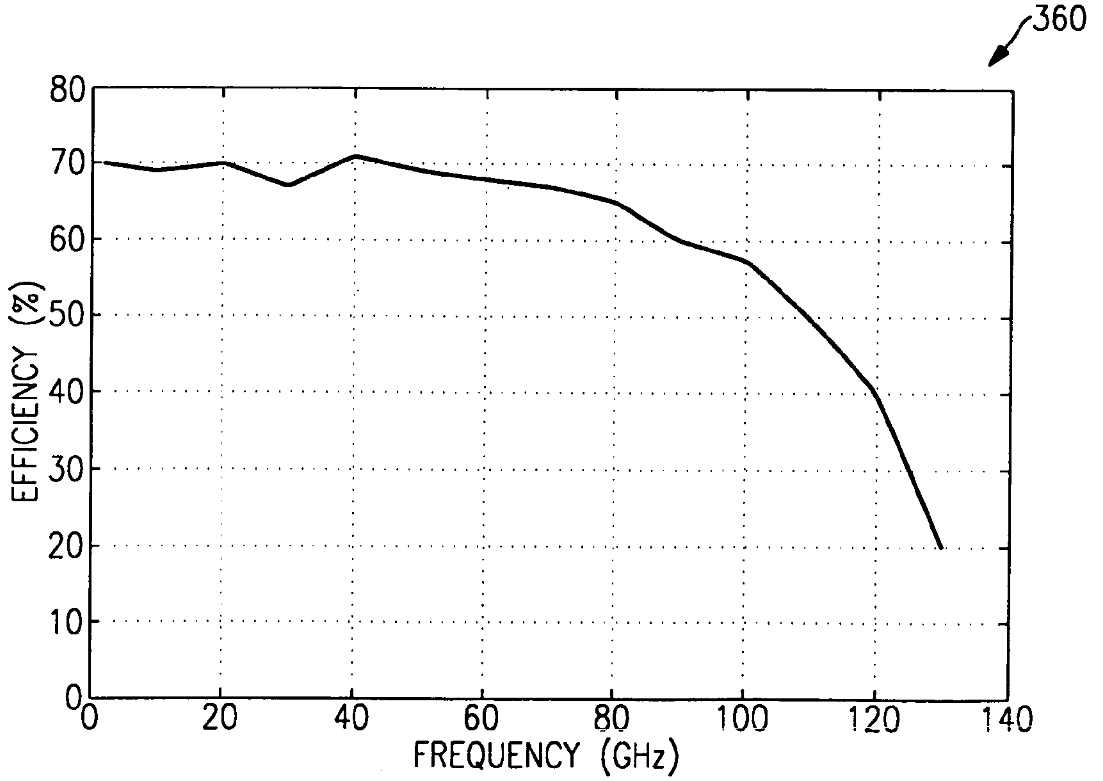
Figure 3D:
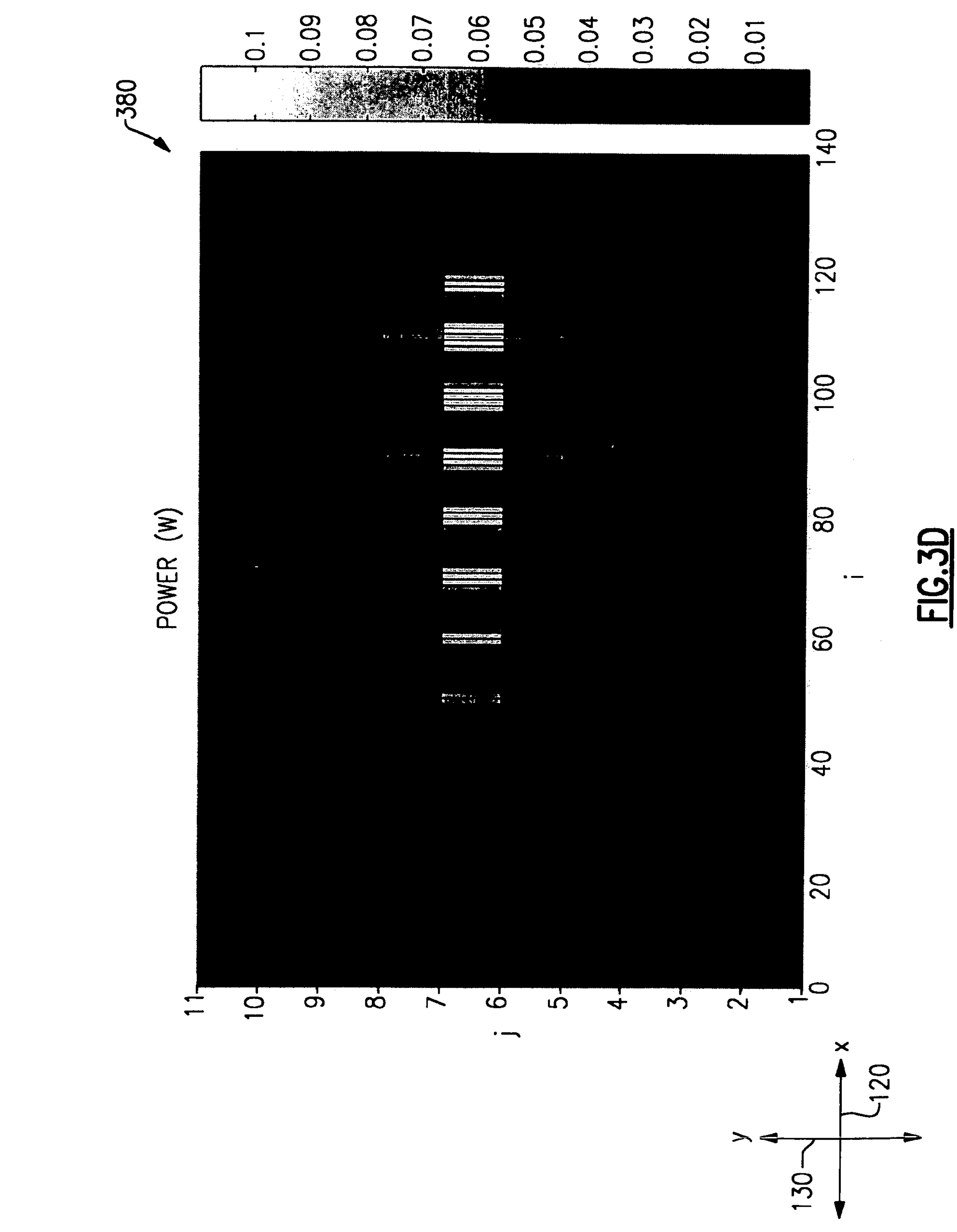

FIGS. 3A-3D illustrate results of simulating (emulating) an ideal electrical funnel using an embodiment of the invention. FIG. 3A illustrates a graph 320 of voltage as a function of section number for the funnel (lattice) 210. FIG. 3B illustrates a graph 340 of current as a function of section number for the funnel (lattice) 210. FIG. 3C illustrates a graph 360 of simulated efficiency as a function of frequency of the input signal for the funnel (lattice) 210. FIG. 3D illustrates a profile 380 of power (W) distributed throughout the funnel (lattice) 210.

Multiple synchronous signal sources driving the left-hand side (from X section number equal to 0) of the funnel (lattice) 210 can generate a planar wave front moving along the X axis 120 towards the right hand side (X section number equal to 140). The output node is at the center of the right boundary (X section number equal to 140). All of the right boundary nodes 216*a*-216*c* are terminated with a resistor matched to the local impedance at that node. The nodes at the boundary having Y section number equal 15 and the nodes at the boundary having Y section number equal 0 are kept open. For one implementation, FIG. 3C illustrates simulated efficiency vs. frequency demonstrating the broadband nature of the electrical funnel (lattice 210). Efficiency is defined by the ratio of the power at the output node to the sum of the powers at the input nodes.

There is a dual circuit that corresponds to the funnel (lattice 210) where the local characteristic impedance is kept independent of the Y axis 130 while the propagation velocity is modified to increase at the top boundary (Y section number equal 15 (j=15)) and bottom boundary (Y section number equal 0 (j=0)) of the combiner lattice 210 as the wave front moves to the right (from X section number equal to 0 (i=0) towards X section number equal to 140 (i=140)). The input sources on the left boundary (X section number equal to 0 (i=0) add coherently at the focal point which should occur in the middle of the right boundary at approximately X=140, Y~7 or 8, (i=140, j=7.5) where the output is taken. The behavior of this lattice 110 resembles the behavior of an optical lens and is thus referred to as an electrical lens, due to its focusing nature. However, this focusing behavior is frequency dependent and hence works perfectly only at one frequency. For other frequencies, the phase shift from the input to the output is different, resulting in a different focal length.

To construct the above described dual circuit, the lattice 210 of FIG. 2 is modified in the following way. The variations of the characteristic impedance values of FIG. 2 are instead modified to equal one uniform value with respect to the Y axis 130. Signal propagation delay values, which affect signal propagation velocity and that were uniform in FIG. 2, are instead varied with respect to the Y axis 130 so that signal propagation delay is minimized, and signal propagation velocity is maximized, at the upper 220*a* and lower 220*b* boundaries of the lattice of FIG. 2.

Figure 4:
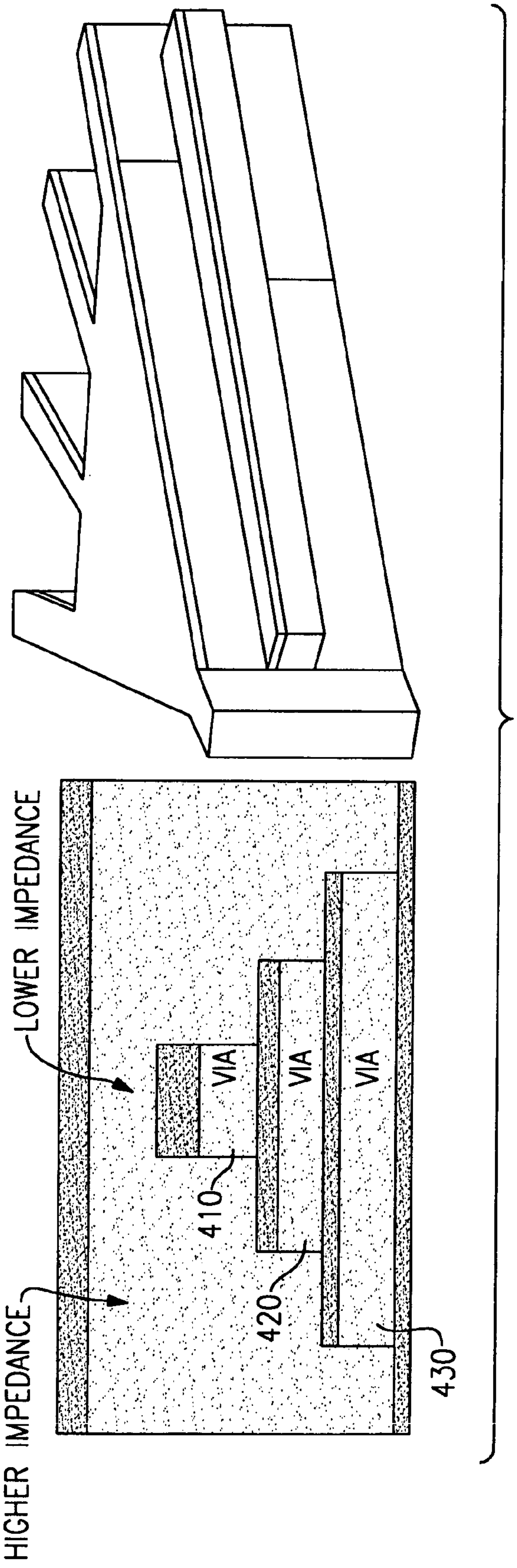
FIG. 4 illustrates use of different metal layers within the two dimensional electrical lattice to implement a separate electrical impedance at a particular location.

FIG. 4 illustrates use of different metal layers 410, 420 and 430 within the electrical lattice to implement a characteristic impedance at a particular location.

Noting that the characteristic impedance at the edge of a rectangular implementation of the funnel increases for larger X 120, it is possible to discard the higher impedance parts of the mesh as a signal propagates to the right side of the lattice 110, 210. In a silicon process with multiple metals, we can use different metal layers at different points on the Y 130 axis resulting in a different capacitance per unit length that can be used to control the local characteristic impedance across the combiner lattice 110, 210 as shown in FIG. 4. By doing so, most of the input power will focus at the output which is matched to 50Ω. The combiner lattice 110, 210 is 410 μm long (X axis 120) and 240 μm across (Y axis 130). It uses four lower metal layers to form the variable depth ground plane. Since we only change the capacitance, and not the inductance, the propagation delay will somewhat vary vs. Y axis direction 130, resulting in a band pass response. One could consider this type of combiner embodiment to be a hybrid between an ideal funnel embodiment and an ideal lens embodiment.

Figure 5:
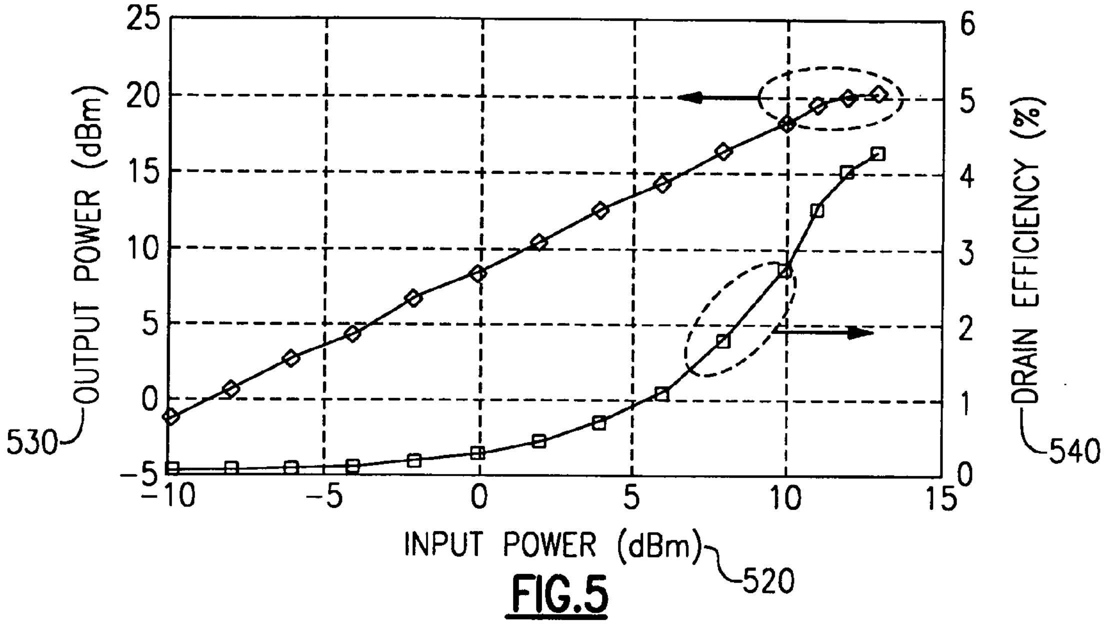
FIG. 5 illustrates output power and drain efficiency of an embodiment of the invention as a function of input power at 84 GHz.

FIG. 5 illustrates output power 530 and drain efficiency 540 of an embodiment of the invention as a function of input power 520 at 84 GHz. The linear amplifiers have two power supplies of −2.5V and 0.8V and draw 750 mA of current. Small-signal gain is approximately 8 dB and efficiency rises as the amplifier enters compression. At this frequency, drain efficiency is more than 4% at 3 dB gain compression.

Figure 6:
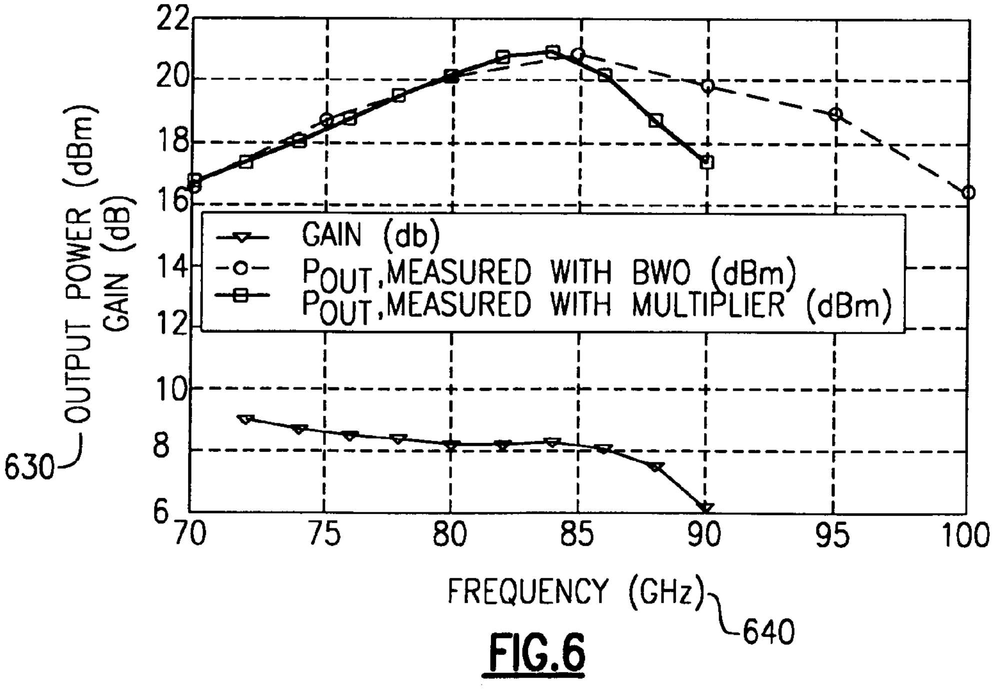
FIG. 6 illustrates a graph of output power and gain as a function of frequency for the embodiment of FIG. 5.

FIG. 6 illustrates a graph of output power and gain 630 as a function of frequency 640 for the embodiment of FIG. 5. The maximum of about 21 dBm in output power 630 was measured using two different signal sources: a backward wave oscillator (BWO) and a frequency multiplier. The lower measured maximum power using the multiplier is due to its limited output power compared to BWO and the lower amplifier gain from 86 to 90 GHz. The peak output power of 125 mW is achieved at 85 GHz, and over 60 mW output power is available between 73 GHz and 97 GHz, or a 3 dB BW of 24 GHz.

Figure 7:
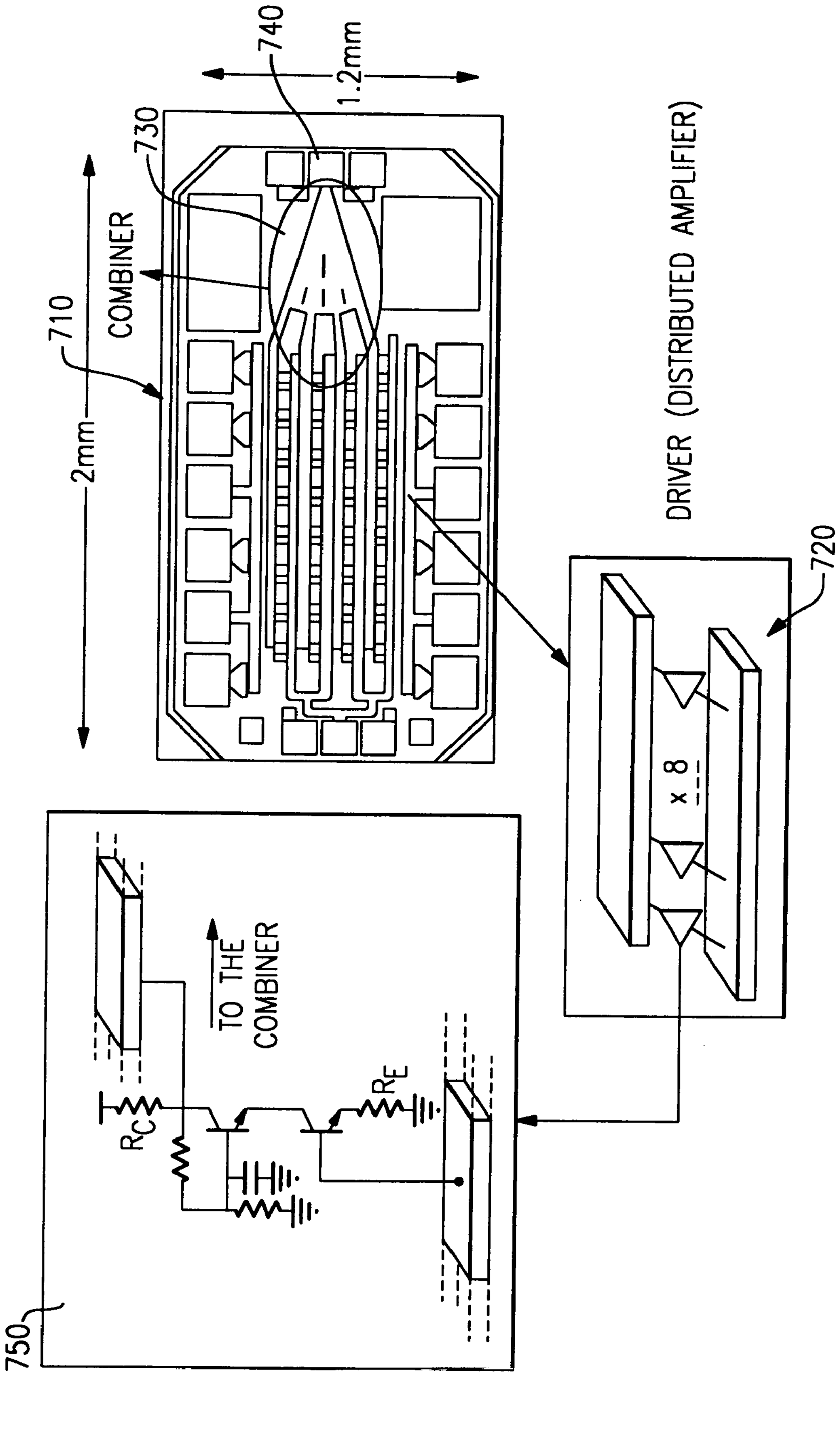
FIG. 7 illustrates a die photo of a power amplifier in a 0.13 μm SiGe BiCMOS with a bipolar cutoff frequency of 200 GHz.

FIG. 7 illustrates a die photo 710 of a power amplifier in a 0.13 μm SiGe BiCMOS with a bipolar cutoff frequency of 200 GHz. In order to obtain a wideband response, we use class-A degenerate cascade distributed amplifier 720 as input driver with emitter degeneration as shown in the left most pane 750 of FIG. 7. A non-degenerate cascade amplifying stage in this process has a maximum stable power gain of 15 dB at 80 GHz, as opposed to 7 dB for a standard common-emitter. The emitter degeneration is used to trade gain for bandwidth. Each amplifier 720 consists of 8 stages driving the output transmission line (as shown in schematic in the pane 720 at the bottom of FIG. 7), which is connected to the combiner 730. The input is divided into 4 paths, each driving an amplifier. After amplification the combiner combines power at the output node 740.

Two-dimensional lattices 110 of inductors and capacitors (2-D LC lattices), an example of which is diagrammed in FIGS. 1A-1B, are a natural generalization of one-dimensional transmission lines. Both linear and nonlinear versions of 2-D (two dimensional) LC (inductor/capacitor) lattices 110 can be for the solution of signal-shaping problems in the frequency range of DC to 100 GHz. One reason for favoring LC lattices is that they are generally composed only of passive devices, which as compared with active devices do not suffer from limited gain, efficiency, and breakdown voltage. Furthermore, the quality factor for passive components is reasonable enough to allow a cut-off frequency of approximately 300 GHz, which is difficult to achieve using active (non-passive) device solutions. Hence 2-D LC lattices are reasonable candidates to introduce into high microwave and millimeter-wave integrated circuit design.

General models for 2-D LC lattices have been derived, starting from Kirchhoff's laws of voltage and current. These models consist of partial differential equations (PDE) arising from continuum and quasi-continuum limits, which are valid for signals with frequency content below a certain threshold value. The quasi-continuum models consist of the continuum models plus higher-order dispersive corrections designed to take into account lattice discreteness. Based on the PDE models and numerical simulations, it was found that a 2-D LC lattice could be used to combine the power from various input signals. Such a lattice has been designed and fabricated on chip in a 0.13 μm SiGe BiCMOS process where it has been used to implement a power amplifier that generates 125 mW at 85 GHz. (See FIGS. 6-7).

We now apply our continuum and quasi-continuum models to demonstrate the possibility of designing 2-D LC lattices that reproduce classical optical refraction and diffraction phenomena. These results are plausible, because the continuum model for a homogeneous 2-D LC lattice is like the scalar wave equation, which also governs scalar fields in the optical context. What is interesting, and what our numerical simulations show, is that discreteness does not present a major obstacle for reproducing optical phenomena in the context of 2-D lattices. A positive result of this finding is that 2-D LC lattices can be used to compute an approximate discrete Fourier transform of an input signal.

Additionally, in a 2-D LC lattice, we are able to vary both inductance and capacitance independently, enabling us to create lattices that have large changes in the signal propagation delay (corresponding to changes in the refraction index in an optical material) while keeping signal impedance constant, or vice versa. Generally, engineering LC lattices is easier, less expensive, and possibly faster than engineering optical materials with similar properties.

Classic texts, such as the text titled "Principals of Optics" authored by M. Born and E. Wolf and the text titled "Introduction to Fourier Optics" authored by J. W. Goodman on wave and Fourier optics concentrate their efforts on three-dimensional media, ostensibly because most experimental diffraction setups involve light propagation in three spatial dimensions. However, the propagation of light in two-dimensional media has been considered before. Diffraction integrals for a two-dimensional dispersion-free continuum were almost likely known to Sommerfeld—see, for example, equations (2.23)-(2.26) of Bouwkamp's survey article (C. J. Bouwkamp, Rep. Prog. Phys. 17, 35 (1954)) and references therein. Recent work in this area is due to J. J. Stamnes, who has derived exact, approximate, and numerical results for focusing and diffraction of two-dimensional waves. Stamnes' results stop short of showing that even for 2-D waves, a standard Fourier transform integral can be derived. Furthermore, Stamnes' work deals exclusively with waves propagating through a dispersionless continuum, which describes our discrete 2-D LC lattice only approximately, and only in certain frequency regimes. Other papers on 2-D diffraction (A. C. Green, H. L. Bertoni, and L. B. Felsen, J. Opt. Soc. Am. 69, 1503 (1979)) and (S. L. Dvorak and H.-Y. Pao, IEEE Trans. Ant. Prop. 53, 2299 (2005)) do not differ in this regard.

The mathematical portion of our work benefits from the classical approaches of Sommerfeld and Kirchhoff, also employed by Stamnes. Their approach for single-slit diffraction problems consists primarily in using one of Green's identities to express the diffracted field at a point $P_0$ in terms of a particular integral around a curve centered at $P_0$. We denote this integral by $I(P_0)$. Next, we assume that the spatial part of the diffracted field is a solution of the Helmholtz equation:

$$(\nabla^2+k^2)\psi=0. \tag{1}$$

Knowledge of the radially symmetric solutions of equation (1), together with a choice of boundary conditions for the field and its normal derivative on the aperture of the slit, enables us to pass from the integral $I(P_0)$ to a diffraction integral. In the present work, we validate our numerical results on diffraction using this classical approach.

The classical work of Brillouin on crystal lattices makes explicit the analogy between crystal lattices, mass-spring models, and LC lattices in one, two, and three spatial dimensions. Brillouin's primary focus in this work was the development of band-gap theories for lattices with periodic in-homogeneities. The lattice in-homogeneities we consider are of an entirely different type.

We first analyze a basic refraction problem in a lattice consisting of two halves separated by a straight line, where one half has a higher signal propagation delay $\sqrt{LC}$ than the other half. We assume that lattice voltage is described by our quasi-continuum model and obtain a dispersively corrected form of Snell's law. Our analyses are corroborated by numerical simulations (emulation) of the fully discrete lattice equations, Kirchhoff's laws of voltage and current.

Next we will examine the problem of diffraction in a uniform 2-D LC lattice. Suppose we have a lattice 110 whose size, in both the X 120 and Y 130 directions, is just a few wavelengths. Then the lattice 110 itself acts like a thin slit diffraction aperture; in other words, as waves propagate from the left to the right boundary of the lattice, it is as if they are propagating from one side of a thin slit diffraction aperture to the other. Numerical experiments bear this out.

Using our continuum model, we derive two-dimensional versions of the Kirchhoff and Rayleigh-Sommerfeld diffraction integrals. Applying the same arguments from Huygens-Fresnel theory, we solve for the illumination, due to a source propagating from the left half of the lattice 110, onto the right boundary of the lattice. We show that under certain reasonable approximations, the illumination is a phase-shifted Fourier transform of the source. By using an appropriate electrical lens, we cancel out this phase shift and thereby show how a 2-D LC lattice can compute an approximate Fourier transform of an input signal. Implementation issues for such a lattice are discussed.

The following describes lattice equations and partial differential equation (PDE) models and Kirchhoff's Laws. For a two-dimensional LC lattice that extends infinitely in both directions, Kirchhoff's laws of voltage and current read:

$$I_{i,j-1/2}+I_{i-1/2,j}-I_{i+1/2,j}-I_{i,j+1/2}=C_{ij}\frac{d}{dt}V_{ij}, \tag{2a}$$

$$V_{i,j-1}-V_{i,j}=L_{i,j-1/2}\frac{d}{dt}I_{i,j-1/2}, \tag{2b}$$

$$V_{i,j}-V_{i+1,j}=L_{i+1/2,j}\frac{d}{dt}I_{i+1/2,j}. \tag{2c}$$

Here we have assumed that the capacitances $C_{ij}$ and the inductances $L_{\alpha\beta}$ stay fixed as a function of time. Otherwise the right-hand sides of equations 2a-2c would have to be modified, and the dynamics of the lattice would be nonlinear. In contrast, system of equations 2a-2c is linear.

The following describes a continuum limit. The continuum limit of equation (3) was derived using standard Taylor series arguments. In the case of a uniform lattice, one can arrive at a continuum limit simply by examining the dispersion relation, a procedure we now describe. Take $C_{ij}=C$ and $L_{\alpha\beta}=L$ everywhere, differentiate equation (2a) with respect to time, and then substitute equations (2b-2c) to derive the single second-order equation for lattice voltage:

$$(V_{i-1,j}-2V_{i,j}+V_{i+1,j}+V_{i,j-1}-2V_{i,j}+V_{i,j+1})=LC\ddot{V}_{ij}. \quad (3)$$

Assume that the spacing between lattice elements is the same in both the X 120 and the Y 130 directions, and denote this constant lattice spacing by d. Then $$V_{i+1,j}(t)=e^{ik_xd}V_{i,j}(t),\ V_{i,j}(t)=e^{ik_yd}V_{i,j}(t),\ V_{i,j}(t)=e^{-i\omega t},$$

one derives the dispersion relation.

$$\omega=\frac{2}{\sqrt{LC}}\left[\sin^2\frac{k_xd}{2}+\sin^2\frac{k_yd}{2}\right]^{1/2}. \quad (4)$$

When $\theta<<1$, we may approximate $\sin\theta\approx\theta$. Therefore, when $k_xd<<1$ and $k_yd<<1$, the dispersion relation may be approximated by $$\omega=\frac{d}{\sqrt{LC}}[k_x^2+k_y^2]^{1/2}. \quad (5)$$

Replace L by dl and C by dc, where l and c are, respectively, inductance and capacitance per unit length. Assuming that l and c stay constant in the d→0 limit, we arrive at the continuum dispersion relation $$\omega=\frac{1}{\sqrt{lc}}[k_x^2+k_y^2]^{1/2}, \quad (6)$$

which is the exact dispersion relation for the scalar wave equation $$\nabla^2 v=lc\frac{\partial^2 v}{\partial t^2}. \quad (7)$$

In previous deviations, we started with (3), then posited a continuous function v(x,y,t) such that $v(id,jd,t)\approx V_{ij}(t)$, expanded $V_{i+\sigma,j}$ and $V_{i,j+\sigma}$ in Taylor series about $V_{i,j}$, and thereby derived precisely the same PDE model of equation (7). The derivation of equation (7) as a continuum model of equation (3) on the basis of exact/approximate dispersion relations has its own utility, as we now show.

The following is a discussion of the range of validity. One wants to understand, quantitatively, where the continuum model of equation (7), is valid. First off, one can easily determine that the relative error in the approximation $\sin^2\theta\approx\theta^2$ is less than 2.5% for $|\theta|<1/4$. Hence we want $k_xd<1/4$ and $k_yd<1/4$. Because wavelength is related to wave number by $\lambda=2\pi/k$, the conditions on $k_x$ and $k_y$ imply $$\frac{\lambda_x}{d},\frac{\lambda_y}{d}>\frac{2\pi}{1/4}\approx 25.$$

As long as one wavelength of the lattice wave occupies more than 25 lattice spacings (sections), the continuum dispersion relation of equation (6) and PDE equation (7) is a reasonable approximation to the fully discrete dispersion relation of equation (4) and differential equation (3).

We may go further. For the sake of illustration, let us fix the inductance and capacitance to be, respectively, L=30 pH and C=20 fF. Inductors and capacitors with these values (and somewhat smaller values) can be fabricated in today's silicon processes; at values that are much smaller, parasitic effects become an issue. Suppose waves of frequency w propagate through such a lattice, in the X 120 direction only. In this case $k_y=0$. The dispersion relation of equation (4) may now be used to determine that, with these parameters, $$k_xd=2\sin^{-1}\frac{\omega}{2.6\times10^{12}}.$$

Then $k_xd<1/4$ as long as w<52 GHz, the cut-off frequency for validity of the continuum model of the 2-D LC lattice. Note also that is easy to read off the cut-off frequency $w_M$ for the lattice itself from the above calculation:

$$w_M\approx2.6\times10^{12}\ \text{sec}^{-1}\approx410\ \text{GHz}$$

The following is a discussion of the dispersive correction. If one seeks a PDE model for equation (3) with an extended range of validity, one way to proceed is to use higher-order terms when approximating sin in equation (4). That is, starting with equation (4), we use a two-term Taylor series approximation for $\sin\theta$, resulting in $$\sin^2\theta\approx\theta^2-\frac{\theta^4}{3}. \quad (8)$$

The resulting approximate dispersion relation is $$\omega=\frac{d}{\sqrt{lc}}\left[k_x^2+k_y^2-\frac{d^2}{12}(k_x^4+k_y^4)\right]^{1/2}. \quad (9)$$

This dispersion relation is the exact dispersion relation for the scalar PDE $$\nabla^2 v+\frac{d^2}{12}\nabla^4 v=lc\frac{\partial^2 v}{\partial t^2}, \quad (10)$$

where $\nabla^4$ is the bilaplacian operator $$\nabla^4=\frac{\partial^4}{\partial x^4}+\frac{\partial^4}{\partial y^4}. \quad (11)$$

Equation (10), derived previously using Taylor series approximations, is a quasi-continuum model for the discrete equation (3). To evaluate where this model is valid, consider that the relative error in the approximation of equation (8) is now less than 2.5% for |x|<1. Repeating the above calculation in this case, we obtain the conditions $$\frac{\lambda x}{d}, \frac{\lambda y}{d} > 2\pi \approx 6.$$

As long as lattice waves occupy at least 7 lattice spacings (sections), the dispersion relation of equation (9) closely matches the true dispersion relation of equation (4). Using the full dispersion relation of equation (4), we determine that this condition holds for plane waves moving in the X 120 direction when w<198 GHz, assuming as before a uniform lattice with inductance L=30 pH and C=20 fF.

The following is a discussion of the effect of the boundaries. Of course, experimentally realizable lattices must be of finite extent. Furthermore, when we numerically simulate the lattice equations, we must take into account appropriate boundary conditions that arise due to finiteness of the lattice. For these reasons we give a few details regarding Kirchhoff's laws on the boundaries.

For a finite lattice with M nodes in the X 120 direction and N nodes in the Y 130 direction, we see that Equation (2a) holds for 2≦i≦M, 2≦j≦N, Equation (2b) holds for 1≦i≦M, 2≦j≦N, and Equation (2c) holds for 1≦i≦M−1, 1≦j≦N.

Equations (2b-2c) already take into account contributions due to voltage nodes on the boundary and need not be modified. Meanwhile, equation (2a) for i=1, i=M, j=1, and j=N must be corrected by deleting those terms on the left-hand side corresponding to edges outside the lattice. Furthermore, we assume the right boundary of the lattice is resistively terminated with resistors obeying Ohm's law, so that the equations for i=M read:

$$C_{Mj}\frac{d}{dt}V_{Mj} = \begin{cases} I_{M-1/2j} - I_{Mj+1/2} - V_{Mj}R_j^{-1} & j = 1 \\ I_{Mj-1/2} + I_{M-1/2j} - I_{M+1/2j} - V_{Mj}R_j^{-1} & 2 \le j \le N-1 \\ I_{Mj-1/2} + I_{M-1/2j} - V_{Mj}R_j^{-1} & j = N. \end{cases}$$

The resistances $R_j$ are chosen to minimize the reflection coefficient for waves incident on the right boundary. This is a basic impedance matching problem, and for a uniform medium the solution is given by choosing $R=\sqrt{L/C}$ everywhere along the right boundary.

Figure 8:
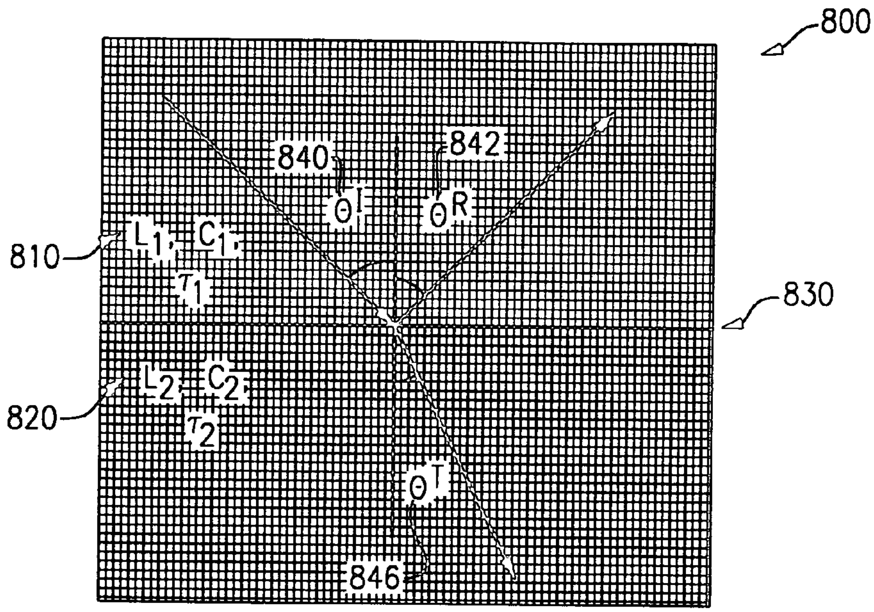
FIG. 8 illustrates at least part of a two dimensional lattice 800 comprising a first portion (region/sub-lattice) configured to have a first signal propagation delay characteristic, a horizontal boundary, and a second portion (region/sub-lattice) configured to have a second signal propagation delay characteristic.

The following describes optical refraction and Snell's Law. FIG. 8 illustrates a two dimensional lattice 800 comprising a first portion (region/sub-lattice) 810 configured to have a first signal propagation delay characteristic, a horizontal interface (boundary) 830, and a second portion (region/sub-lattice) 820 configured to have a second signal propagation delay characteristic. FIG. 8 shows the simplest scenario: a 2-D LC lattice with a jump in the signal propagation delay, $\tau=\sqrt{LC}$, along a horizontal interface (boundary) 830. That is to say, above the interface, the signal propagation delay equals $\tau_1=\sqrt{L_1C_1}$, while below the interface (boundary), the signal propagation delay equals $\tau_2=\sqrt{L_2C_2}$. An incident wave arrives at the interface 830 (from above) at an angle $\theta^I$ 840 and is partly reflected at an angle $\theta^R$ 842, and partly transmitted at an angle $\theta^T$ 846.

The continuum model for the lattice is given by equation (7), repeated here:

$$\nabla^2 V = \tau^2 \frac{\partial^2 V}{\partial t^2} \tag{12}$$

where V is the voltage and the signal propagation delay $\tau=\sqrt{LC}$. By assuming that the incident, reflected, and transmitted waves are plane wave solutions of equation (12), propagating with the appropriate dispersion relation depending on whether they are in the upper or lower portions (halves) of the lattice 800, one can apply standard arguments to derive $\theta^I=\theta^R$, as well as Snell's law:

$$\frac{\sin\theta^T}{\sin\theta^I} = \frac{\tau_1}{\tau_2}. \tag{13}$$

The derivation of equation (13) starting from equation (12) is completely standard and we shall not repeat it here. Instead, let us examine the effect of discreteness on the simple refraction problem—more specifically, let us derive a version of Snell's law that accounts (to lowest order) for the dispersion induced by discreteness. Suppose that the incident, reflected, and transmitted waves are solutions of the dispersive, quasi-continuum model $$\nabla^2 V + \frac{h^2}{12}\nabla^4 V = \tau^2 \frac{\partial^2 V}{\partial t^2}, \tag{14}$$

where $\nabla^4$ is the bilaplacian defined in equation (11). This equation has plane wave solutions of the form $$V=\exp(i(k\cdot x-\omega t))$$

as long as frequency w and wave number k are related by the dispersion relation $$\omega^2 = \frac{1}{\tau^2}\left[\|k\|^2 - \frac{h^2}{12}(k_x^4 + k_y^4)\right].$$

With this dispersion relation, we consider the standard refraction problem, and assume plane wave forms $$V^I=\exp(i(k^I\cdot x-\omega^I t))$$

$$V^R=R\exp(i(k_R\cdot x-\omega^R t))$$

$$V^T=T\exp(i(k^T\cdot x-\omega^T t))$$

for incident, reflected, and transmitted voltage. By matching voltages at the interface y=0, we obtain $$\exp i(k_x^1 x-\omega_I t)+R\exp i(k_x^R x+\omega_R t)=T\exp i(k_x^T x-\omega_T t), \tag{15}$$

which must be true for all x and all t. Therefore we must have the following equalities:

$$k_x^R=k_x^T=k_x^1 \tag{16}$$

$$\omega^R=\omega^T=\omega^1 \tag{17}$$

These equalities are quite useful in the following derivation. The derivation of a dispersively corrected version of Snell's law begins by noticing from the geometry of the problem that $$\frac{\sin\theta^T}{\sin\theta^I} = \frac{\|k^I\|}{\|k^T\|}. \tag{18}$$

The procedure from here onwards consists of using equalities of equations (16-17) together with the dispersion relations in the y<0 and y>0 half-planes to try and express the right-hand side of equation (18) in terms of incident wave number $k^I$, the lattice spacing h, and the signal propagation delays; $\tau_1$ and $\tau_2$. Assuming we have done that, we can expand the right-hand side in powers of h. At order $h^o$ we expect to recover the non-dispersive Snell's law of equation (13).

We begin by rearranging the dispersion relation in the y<0 half-plane to write $$\|k^T\| = \sqrt{\tau_2^2\omega^2 + \frac{h^2}{12}[k_x^{T4} + k_y^{T4}]},$$

which we then substitute into the denominator of equation (18), producing $$\frac{\sin\theta^T}{\sin\theta^I} = \sqrt{\frac{k_x^{I2} + k_y^{I2}}{\tau_2^2\omega^2 + \frac{h^2}{12}[k_z^{I4} + k_y^{T4}]}}. \tag{19}$$

Here we have used $k_x^T = k_x^1$. The dispersion relation for $w^I$ reads $$\omega^2 = \frac{1}{\tau_1^2}\left[\|k^I\|^2 - \frac{h^2}{12}\left(k_x^{I4} + k_y^{I4}\right)\right].$$

Substituting this into equation (19) and squaring both sides gives $$\left(\frac{\sin\theta^T}{\sin\theta^I}\right)^2 = \frac{k_x^{I2} + k_y^{I2}}{\tau_2^2\tau_1^{-2}\left[\begin{array}{c} k_x^{I2} + k_y^{I2} - \\ \frac{h^2}{12}(k_x^{I4} + k_y^{I4}) \end{array}\right] + \frac{h^2}{12}[k_x^{I4} + k_y^{T4}]}, \tag{20}$$

As regards the y-component of the outgoing wave vector, '$k_y^T$' using $w^T = w^I$ and the dispersion relation, we write $$\frac{1}{\tau_1^2}\left[\|k^I\|^2 - \frac{h^2}{12}\left(k_x^{I4} + k_y^{I4}\right)\right] = \frac{1}{\tau_2^2}\left[\begin{array}{c} \|k^T\|^2 - \\ \frac{h^2}{12}\left(k_x^{T4} + k_y^{T4}\right) \end{array}\right]. \tag{21}$$

After substituting $k_x^T = k_x^I$, we use the quadratic formula to solve for $k_y^{T^2}$ as a function of $k^I$. The result is $$k_y^{T2} = \frac{6\tau_1^2 \mp \sqrt{\begin{array}{c} (-h^4k_x^{I4} + 12h^2k_x^{I2} + 36)\tau_1^4 + \\ h^2\left(h^2k_x^{I4} - 12k_x^{I2} + h^2k_y^{I4} - 12k_y^{I2}\right)\tau_2^2\tau_1^2 \end{array}}}{h^2\tau_1^2}, \tag{22}$$

and we choose the root with a negative sign because its h→0 limit reproduces the non-dispersive relationship $$k_y^{T2} = \frac{\tau_2^2}{\tau_1^2}\left(k_x^{I2} + k_y^{I2}\right) - k_x^{I2}. \tag{23}$$

Finally we substitute equation (22) in equation (20) and obtain a lengthy expression that depends only on $\tau_1$, $\tau_2$, h, and $k_I$. Taylor expansion of this expression in powers of h gives a dispersive $0(h^2)$ correction to Snell's law:

$$\left(\frac{\sin\theta^T}{\sin\theta^I}\right)^2 = \frac{\tau_1^2}{\tau_2^2} + h^2\left[\frac{\begin{array}{c}(1 - \tau_1^2/\tau_2^2) \\ \left(2k_x^{I4}\tau_1^2/\tau_2^2 - \|k^I\|^4\right)\end{array}}{6\|k^I\|^2}\right] + O(h^4). \tag{23}$$

Note that the dispersive correction depends on signal propatation delays $\tau_1$ and $\tau_2$ only through the ratio $\tau_1/\tau_2$. Note also that when $\tau_1 = \tau_2$, the $O(h^2)$ term vanishes and we recover $\sin\theta^T = \sin\theta^I$.

Let us rewrite (23) slightly by factoring out $\|k^1\|^2$ from the $O(h^2)$ term:

$$\left(\frac{\sin\theta^T}{\sin\theta^I}\right)^2 = \frac{\tau_1^2}{\tau_2^2} + \frac{h^2\|k^I\|^2}{6}\left(1 - \frac{\tau_1^2}{\tau_2^2}\right)\left(2\frac{k_x^{I4}}{\|k^I\|^4}\frac{\tau_1^2}{\tau_2^2} - 1\right) + O(h^4).$$

Note that $$\frac{k_x^{I4}}{\|k^I\|^4} = \sin^4\theta^I.$$

Next, assuming $h\|k^I\|$ is small, we may use $\sqrt{\alpha^2+\phi} \approx \alpha + \phi/(2\alpha)$ to write $$\frac{\sin\theta^T}{\sin\theta^I} = \frac{\tau_1}{\tau_2} + \frac{h^2\|k^I\|^2}{12}\left(1 - \frac{\tau_1^2}{\tau_2^2}\right)\left(2\sin^4\theta^I\frac{\tau_1^2}{\tau_2^2} - 1\right)\frac{\tau_2}{\tau_1} + O(h^4). \tag{24}$$

Given $\theta^I$ 840, h, and $\tau_1/\tau_2$, it is easy to evaluate this formula to obtain the refracted angle $\theta^T$ 846.

The following describes a thick parabolic lens. Suppose we have a parabolic lens described by F(x, y)=0 where $$F(x, y) = x - \frac{\alpha}{2}y^2.$$

Figure 9:
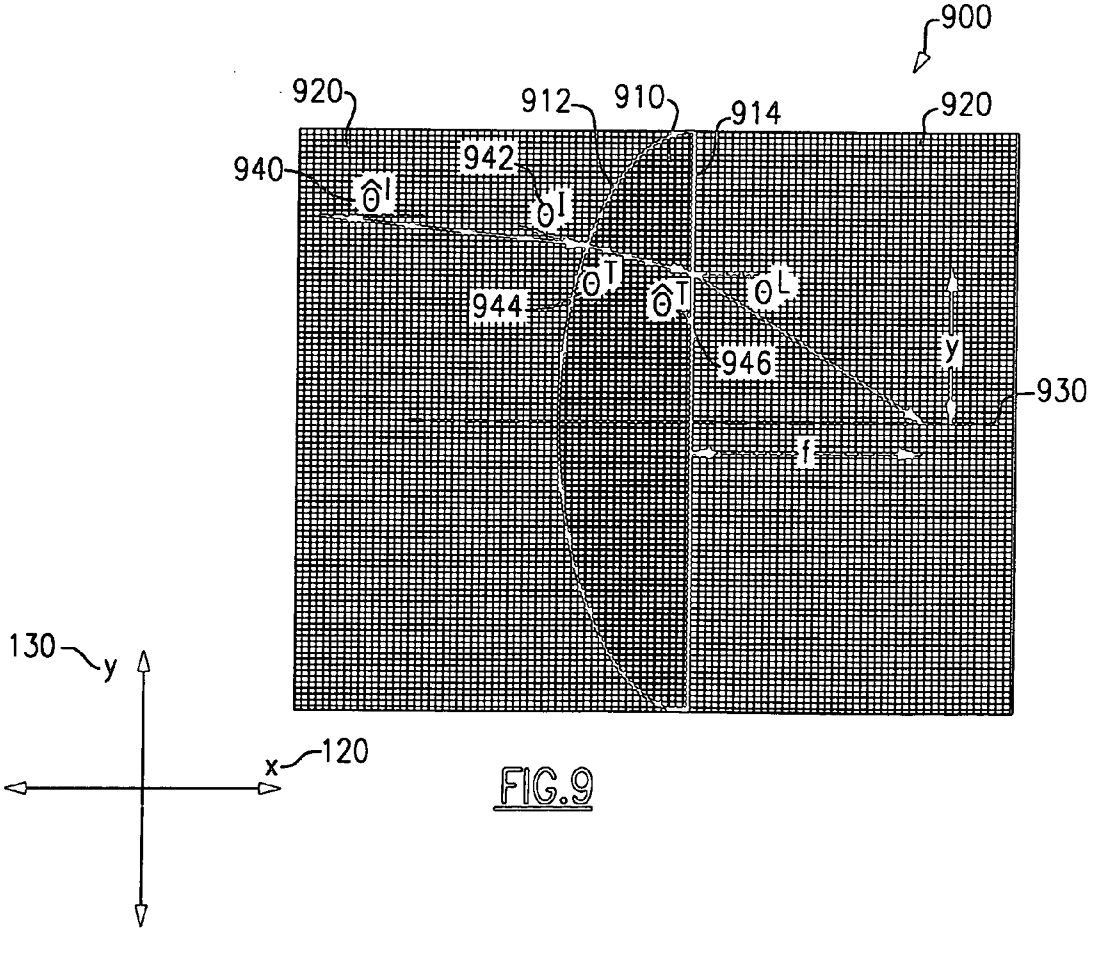
FIG. 9 illustrates at least part of a two dimensional lattice 900 comprising a first portion (region/sub-lattice) configured to have a shape of a parabolic lens and comprising a second portion (region/sub-lattice) configured to have a shape of a space surrounding the parabolic lens.

The curve F(x, y)=0 is the left boundary 912 of the lens. The right boundary 914 of the lens is taken to be a vertical line as in FIG. 9. FIG. 9 illustrates a two dimensional lattice 900 comprising a first portion (region/sub-lattice) 910 configured to have a shape of a parabolic lens and a second portion (region/sub-lattice) 920 configured to have a shape of a space surrounding the parabolic lens. In other embodiments, other lens types, such as including concave and convex lenses, can be emulated employing a sub-lattice of a corresponding shape.

Suppose we have a wave front propagating from left to right at angle $\hat{\theta}^I$ 940, incident on the left boundary 912 of the lens. The wave front's angle from the normal is given by $\theta^I=\hat{\theta}^1+\tan^{-1}(\alpha y)$ We use Snell's law to compute the angle of the transmitted wave:

$$\sin\theta^T = \frac{\tau_1}{\tau_2}\sin\theta^I = \frac{\tau_1}{\tau_2}\sin\left(\hat{\theta}^I + \tan^{-1}(\alpha y)\right).$$

Of course, $\theta^T$ 944 is the angle the transmitted wave front makes with the normal to the curved part of the lens. Subtracting off the contribution of this normal, we obtain $$\begin{aligned}\hat{\theta}^T &= \theta^T - \tan^{-1}(\alpha y)\\ &= \sin^{-1}\left[\frac{\tau_1}{\tau_2}\sin\left(\hat{\theta}^I + \tan^{-1}(\alpha y)\right)\right] - \tan^{-1}(\alpha y)\end{aligned}$$

The angle $\hat{\theta}^T$ 946 is the angle of incidence for the refraction problem at the right boundary 914 of the lens. This is a simple consequence of the fact that the right boundary 914 of the lens is vertical. We apply Snell's law again to determine the angle of the outgoing wave that is transmitted through the right boundary 914 of the lens:

$$\begin{aligned}\sin\theta^L &= \sin\hat{\theta}^T\frac{\tau_2}{\tau_1}\\ &= \sin\left\{\sin^{-1}\left[\frac{\tau_1}{\tau_2}\sin\left(\hat{\theta}^I + \tan^{-1}(\alpha y)\right)\right] - \tan^{-1}(\alpha y)\right\}\frac{\tau_2}{\tau_1}\end{aligned}$$

Simple geometry shows that $$\frac{y}{f} = \tan\theta^L,$$

where f is the focal distance. This implies that $$\begin{aligned}f &= \frac{y}{\tan\theta^L}\\ &= y\left[\tan\sin^{-1}\left(\sin\left\{\sin^{-1}\left[\frac{\tau_1}{\tau_2}\sin\left(\begin{matrix}\theta^I +\\ \tan^{-1}(\alpha y)\end{matrix}\right)\right] - \tan^{-1}(\alpha y)\right\}\frac{\tau_2}{\tau_1}\right)\right]^{-1}.\end{aligned}$$

The following describes paraxial approximation. Note that we can easily recover the paraxial approximation from the above formula for f. First set $\hat{\theta}^I=0$. Next assume $\alpha \ll 1$, which in essence converts all of the nonlinear functions tan and sin to the identity, i.e., if $q=O(\alpha)$, then $$\tan q \approx q,\ \sin q \approx q,$$

and likewise for the inverse functions. One obtains for the denominator of the approximation $$\tan\sin^{-1}\left(\sin\left\{\sin^{-1}\left[\frac{\tau_1}{\tau_2}\sin\left(\begin{matrix}\hat{\theta}^I +\\ \tan^{-1}(\alpha y)\end{matrix}\right)\right] - \tan^{-1}(\alpha y)\right\}\frac{\tau_2}{\tau_1}\right) \approx \left\{\frac{\tau_1}{\tau_2}\alpha y - \alpha y\right\}\frac{\tau_2}{\tau_1} \approx \left(1 - \frac{\tau_2}{\tau_1}\right)\alpha y.$$

Therefore f can be approximated by $$f \approx \frac{y}{\left(1 - \frac{\tau_2}{\tau_1}\right)\alpha y} = \frac{1}{\alpha\left(1 - \frac{\tau_2}{\tau_1}\right)}.$$

Figure 10:
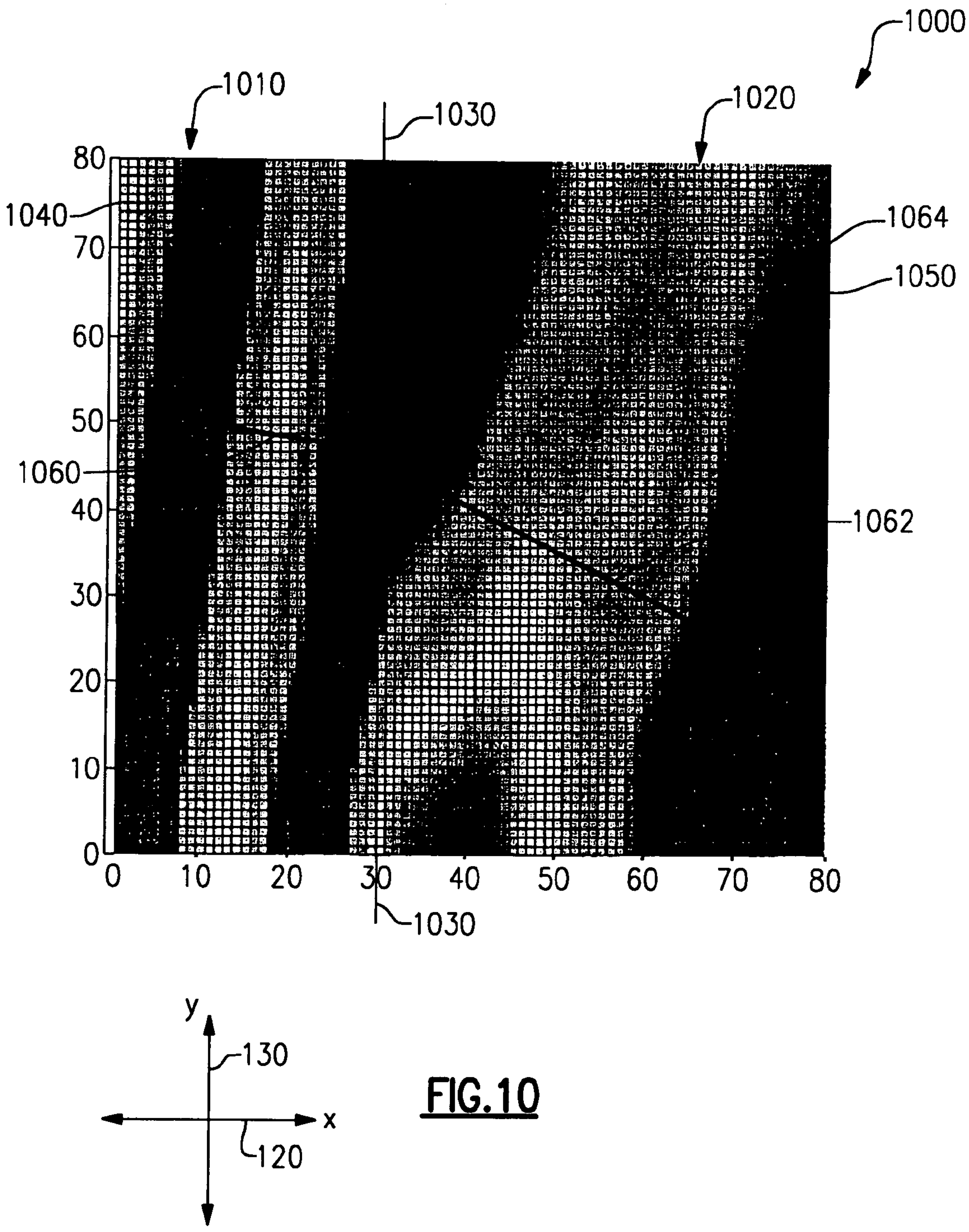
FIG. 10 illustrates at least part of a two dimensional lattice 1000 comprising a first portion (region/sub-lattice) configured to have a first signal propagation delay characteristic, a vertical boundary, and a second portion (region/sub-lattice) configured to have a second signal propagation delay characteristic.

FIG. 10 illustrates a two dimensional lattice 1000 comprising a first portion (region/sub-lattice) 1010 configured to have a first signal propagation delay characteristic, a vertical interface (boundary) 1030, and a second portion (region/sub-lattice) 1020 configured to have a second signal propagation delay characteristic.

This illustrates refraction in a 2-D LC lattice, showing the validity of Snell's law. The black lines 1060, 1062 show incident and refracted wave vectors predicted by Snell's law. The colors (shades of gray) correspond to level sets of the voltage $V_{ij}(t)$, at a particular instant of time $t>0$. At $t=0$, voltage forcing is switched on along the left boundary 1040 and resulting waves propagate at an angle, towards the interface 1030 at $i=30$, where they are refracted, causing a change in the direction and wavelength of the wave. For $i<30$, the lattice signal propagation delay equals $\tau_1$, while for $i>30$, the lattice signal propagation delay equals $\tau_2$.

The following describes the numerics. We simulate the lattice by solving Kirchoff's laws (2) for an 80×80 lattice with boundary conditions given in the discussion of dispersive correction. For these simulations (emulations), we have one (or more) vertical interface(s) 1030 separating two (or more) portions (sections) 1010, 1020 of the lattice 1000. In certain sections of the lattice 1000, we have $L_1=1$ nH and $C_1=1$ pF, while in other sections, we have $$L_2=L_1\sqrt{10},\ C_2=C_1\sqrt{10}.$$

For the purposes of the following discussion, we define the following lattice signal propagation delay constants:

$$\tau_1=\sqrt{L_1C_1}=10^{-10.5}\ \text{sec}^{-1}$$

$$\tau_2=\sqrt{L_2C_2}=10^{-11}\ \text{sec}^{-1},$$

In all simulations that follow, the frequency in time of the boundary forcing is w=1 G rad/sec.

Figure 11:
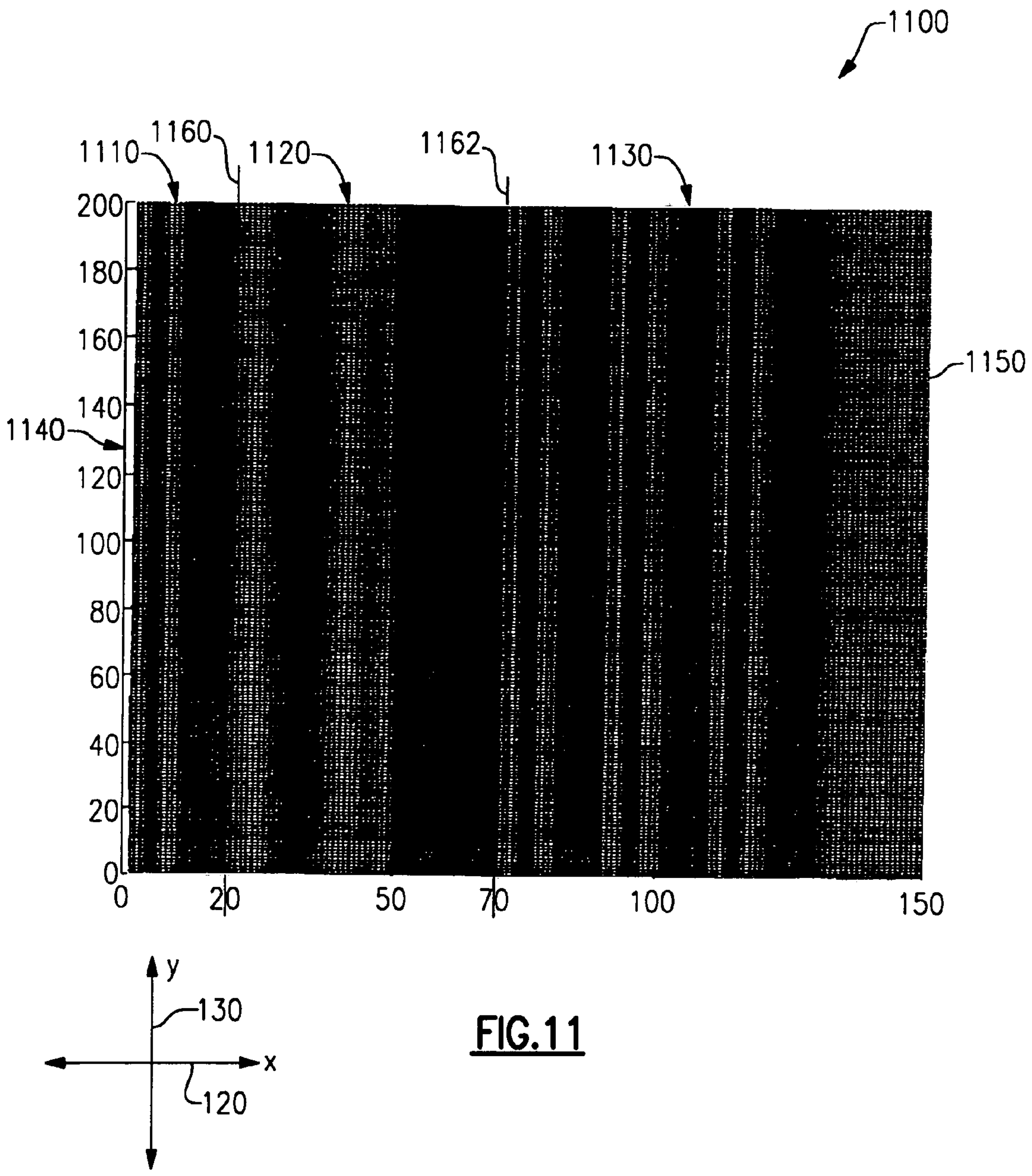
FIG. 11 illustrates at least part of a two dimensional lattice 1100 comprising and a first portion (region/sub-lattice) configured to have a first signal propagation delay characteristic, a first vertical boundary, and a second portion (region/sub-lattice) configured to have a second signal propagation delay characteristic, a second vertical boundary, and a third portion (region/sub-lattice) configured to have the first signal propagation delay characteristic.

The following is discussion of Snell's Law. For the first simulation (emulation), we take the lattice to have a single interface 1030 at $i=30$. For $i<30$, the signal propagation delay is $\tau_1$, while for $i>30$, the signal propagation delay is $\tau_2$. Hence the effective index of (optical) refraction is $\tau_1/\tau_2=\sqrt{10}$. The incident angle, for the wave propagating from the left boundary 1040 towards the interface, is approximately $$\theta^I \approx 0.149\ \text{rad},$$

and based on Snell's law we predict a transmitted angle $$\theta^T \approx 0.488\ \text{rad},$$

which is exactly what we see in the numerical simulation results displayed in FIG. 11. The black lines 1060, 1062 are drawn to match the incident and refracted wave vectors, as predicted by Snell's law. Note that the black line 1062 in the i>30 region is orthogonal to the numerically generated wave fronts 1064. This implies that, in the direct numerical simulation, the angle that the refracted waves make with the normal to the interface is given quite accurately by Snell's law.

FIG. 11 illustrates a two dimensional lattice 1100 comprising and a first portion (region/sub-lattice) 1110 configured to have a first signal propagation delay characteristic, a first vertical interface (boundary) 1160, and a second portion (region/sub-lattice) 1120 configured to have a second signal propagation delay characteristic, a second vertical (interface) boundary 1162, and a third portion (region/sub-lattice) 1130 configured to have the first signal propagation delay characteristic.

The following describes plane waves refracted by a slab.

This illustrates a plane slab showing pure transmission and wavelength expansion in the 20≦i≦70 section. The colors (shades of gray) correspond to level sets of the voltage $V_{ij}(t)$, at a particular instant of time t>0. At t=0, voltage forcing is switched on along the left boundary 1140 and the resulting waves propagate to the right, towards the interface 1160 at i=20, where they are refracted, causing a change in wavelength. At i=70, the wave encounters a second interface 1162 and is refracted again, causing the wavelength to return to its original value. The lattice signal propagation delay equals $\tau_1$ except inside the 20≦i≦70 section, where the delay equals $\tau_2$.

Next we examine a portion (section) 1120 of lattice 1100 with signal propagation delay $\tau_2$ sandwiched between two portions (sections) 1110, 1130 with signal propagation delay $\tau_1$. Here we take the incident angle to be zero, and note the change in wavelength of the wave as it propagates in the $\tau_2$ portion (section) (See FIG. 12). Here the signal propagation delay is $\tau_1$ for i<20 and i>70, and the signal propagation delay $\tau_2$ for 20≦i≦70. Waves propagate from the left boundary 1140 towards the first interface 1160 at (i=20), undergo refraction and a change in wavelength, and continue propagating to the right until they are refracted again at the second interface 1162 at (i=70), at which point their wavelength increases back to its original value. Impedance is matched at both interfaces 1160, 1162 so there is no reflection, i.e., there is no wave propagating from right to left from the interface 1160, 1162 back towards the left boundary 1140.

Figure 12:
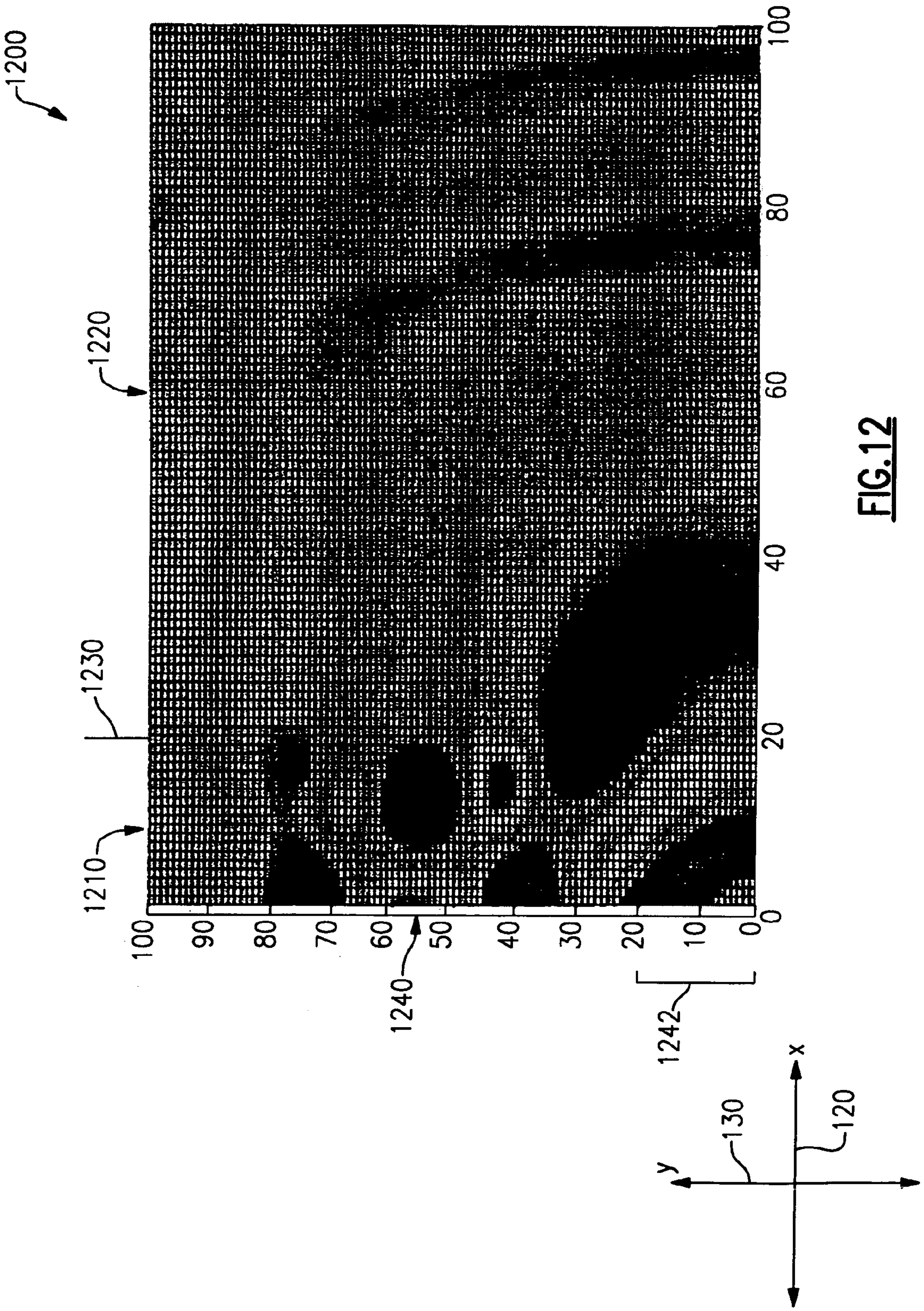
FIG. 12 illustrates at least part of a two dimensional lattice 1200 that emulates total internal reflection and comprises a first portion (region/sub-lattice) configured to have a first signal propagation delay characteristic, a vertical boundary, and a second portion (region/sub-lattice) configured to have a second signal propagation delay characteristic, and input nodes located within a lower left corner of the lattice.

FIG. 12 illustrates a two dimensional lattice 1200 that emulates total internal reflection and comprises and a first portion (region/sub-lattice) 1210 configured to have a first signal propagation delay characteristic, a vertical interface (boundary) 1230, and a second portion (region/sub-lattice) 1220 configured to have a second signal propagation delay characteristic, and input nodes located within a lower left corner 1242 of the lattice 1200.

This illustrates total internal reflection. The colors (shades of gray) correspond to level sets of the voltage $V_{ij}(t)$, at a particular instant of time t>0. At t=0, voltage forcing is switched on along the left boundary 1240 at nodes 1≦i≦20; resulting waves propagate at a sharp angle towards the interface 1230 at i=20, where they undergo total internal reflection and are sent back towards the boundary at i=0. The waves bounce repeatedly off the effective boundaries 1240, 1230 at i=0 and i=20 as they propagate upwards towards j=100. The lattice delay equals $\tau_1$ for i<20 for i<20 and equals $\tau_2$ for i<20. In this simulation (emulation), unlike the previous two, we used a 100×100 lattice.

Here the wave is launched from the left boundary 1240 and, more specifically, from the lower-left corner 1242 of the lattice 1200 consisting of the first 20 nodes 1≦i≦20 on the left boundary 1240. The nodes on the left boundary 1240 with j>20 are left open, meaning that waves will reflect perfectly off those nodes. The wave propagates at an angle of roughly 56 degrees and intersects (hits) the interface 1230, located at i=20. Because the effective index of refraction is $\sqrt{10}$, the critical angle for total internal reflection is approximately 18.5 degrees, so our incident angle is well beyond that. FIG. 12 shows the wave bouncing off the i=20 boundary at approximately j=30, then propagating back towards the left boundary 1240 at (i=0), and then continuing to bounce off different boundaries as it propagates towards j=100.

Figure 13:
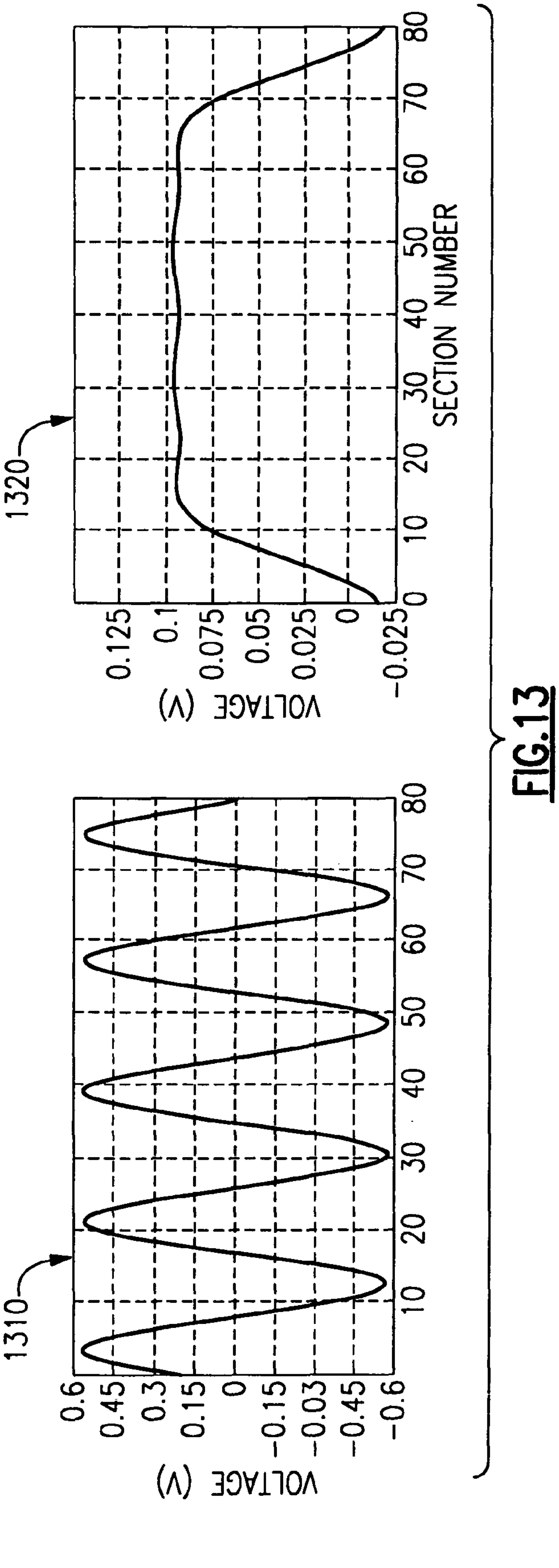
FIG. 13 illustrates a graph of voltage as a function of a location within a two dimensional lattice having uniform inductance and capacitance characteristics.

FIG. 13 illustrates graphs of voltage as a function of location within a two dimensional lattice 110 having uniform inductance and capacitance characteristics.

This illustrates the simulation (emulation) of a uniform 2-D LC lattice showing diffractive effects. The input signal 1310 is our choice of forcing function at the left boundary of the lattice 110, and the output signal 1320 is the signal at the right boundary of the lattice 110. The forcing is sinusoidal and given by equation (25), with w=60 GHz. Lattice inductances are L=30 pH and lattice capacitances are C=20 fF.

The following describes optical diffraction. The lattices that were simulated (emulated) were all finite in extent. Let us turn our attention to waves with wavelength sufficiently large so that only a few wavelengths fit in the finite lattice 110. In this situation, we claim that the lattice 110 acts as a diffraction slit. To give a definite example, consider a 100×80 lattice where we drive the left boundary as follows:

$$V_{i,j}(t)=0.5\sin(\beta j)\sin(2\pi\omega t). \tag{25}$$

Take the lattice parameters to be L=30 pH and C=20 fF, and take the driving frequency to be w=60 GHz. Then the dispersion relation for the lattice tells us that waves propagating in the X direction 120 only have the following ratio of wavelength to lattice spacing:

$$\frac{\lambda}{d}=\frac{\pi}{\sin^{-1}\left(\omega\sqrt{LC}/2\right)}\approx 21.4.$$

In other words, there are only about 4 or 5 wavelengths of the wave that can fit inside the 100×80 lattice. Moreover, if the forcing is of the form of equation (25), then the wave will not propagate in the X direction 120 only. Parts of the wave will reflect off the top and bottom boundaries of the lattice in ostensibly complicated ways, and we would not expect the outgoing signal 1320, $V_{100,j}(t)$, to look anything like the original input signal 1310, $V_{0,j}(t)$.

The problem of squeezing a long wave through a narrow opening is really just a thin-slit diffraction problem. We are about to consider the problem of two uniform 2-D continuous media separated by a thin one-dimensional slit, where the slit is just a few wavelengths wide. Waves propagating from left to right through the slit are diffracted, and one can develop a Huygens-Fresnel type theory to predict the illumination far to the right of the aperture, due to a source to the left of the aperture. Roughly speaking, the illumination will be a phase-shifted Fourier transform of the source.

Going back to the 100×80 lattice with the above choice of parameters and the sinusoidal forcing of equation (25), FIG. 13 shows what we see from a numerical simulation of the 2-D LC lattice equation (2).

The input signal 1310 is a sinusoidal function of the vertical coordinate j (Y direction 130), and the output signal 1320 is clearly a different sort of function altogether. It turns out that the output is a phase-shifted or "blurry" version of a 1-D Fourier transform of the input signal 1310. Eventually we will show simulations of a lattice 110 with the same parameters, except inside a lens-shaped region in the lattice interior. The lens will cancel out the phase shift and bring the Fourier transform into focus.

Figure 14:
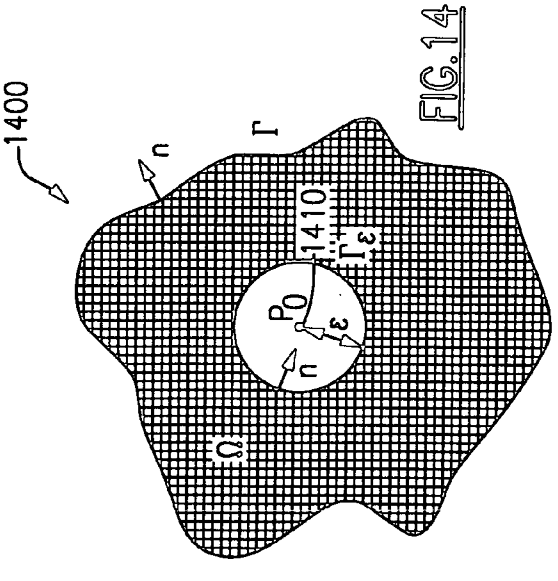
FIG. 14 illustrates a portion (region/sub-lattice) of a two dimensional lattice 1400 that supports a discussion of Greens identity.

FIG. 14 illustrates a portion 1400 of a two dimensional lattice that supports a discussion of Greens identity. Before discussing these simulations (emulations), let us take a moment to develop the elementary theory of scalar diffraction for 2-D waves. Though derivations of Kirchhoff and Rayleigh-Sommerfeld diffraction integrals have appeared in the literature before, we offer derivations here. This is in part because diffraction of 2-D waves has not attracted much attention in the literature, and the reader may not be fully aware of the near and far field Hankel function asymptotics necessary to proceed in this case. Also, we believe our derivations, which follow the models set before by Born, Wolf, Goodman, and Stamnes (J. J. Stamnes, Waves in Focal Regions, Hilger, Bristol, UK, 1986) have their own advantages. We begin by proving a Green's identity that forms the cornerstone of the 2-D wave theory of diffraction. Suppose we have a 2-D domain Ω, as in FIG. 14.

Assume that U is a scalar field that satisfies the Helmholtz equation $$(\nabla^2+k^2)U=0$$

Given a point $P_0$ 1410 where $P_0 \epsilon \Omega$, we want to relate $U(P_0)$ to the values of U on the boundary of Ω, which we label as ∂Ω. Use Green's Theorem (with U, G as solutions of the Helmholtz equation) which says $$\int\int_{\Omega} U\nabla^2 G - G\nabla^2 U\, ds = \int\int_{\partial\Omega} U\frac{\partial G}{\partial n} - G\frac{\partial U}{\partial n}\, dl.$$

Because $\nabla^2 G=-k^2 G$, and $\nabla_2 U=-k^2 U$, the left-hand side of the above equation is zero, $\iint_\Omega U(-k^2G)-G(-k^2U)ds=0$.

The boundary of Ω is the sum of two curves Γ and $\Gamma_\epsilon$. The outer curve Γ is smooth but otherwise arbitrary. The inner curve $\Gamma_\epsilon$ is a circle of radius ϵ with center $P_0$. Green's Theorem says $$0 = \int_{\partial\Omega} U\frac{\partial G}{\partial n} - G\frac{\partial U}{\partial n}\, dl,$$

and because $$\partial\Omega=\Gamma+\Gamma_\epsilon,$$

this implies $$-\int_{\Gamma_4} U\frac{\partial G}{\partial n} - G\frac{\partial U}{\partial n} dl = \int_{\Gamma} U\frac{\partial G}{\partial n} - G\frac{\partial U}{\partial n} dl. \quad (26)$$

We evaluate the left integral, using the fact that on the curve $\Gamma_{\epsilon 1}$ we have $dl=\epsilon d\theta$. We set G(r) equal to the radially symmetric solutions of the 2D Helmholtz equation. These are solutions of the equation $$\frac{1}{r}\frac{\partial}{\partial r}\left(r\frac{\partial G}{\partial r}\right) + k^2 G = 0,$$

which is in fact Bessel's equation, Solutions of Bessel's equation are Hankel functions, i.e., $$G(r)=H_0(kr)=J_0(kr)+iY_0(kr),$$

where $J_0$ is a Bessel function of the first kind and $Y_0$ is a Bessel function of the second kind. Then $$-\int_{\Gamma_4} U\frac{\partial G}{\partial n} - G\frac{\partial U}{\partial n}\, dl = -2\pi\epsilon\left(-kU(P_0+\epsilon)\frac{\partial H_0}{\partial r}(k\epsilon) - H_0(k\epsilon)\frac{\partial U}{\partial n}\right) \quad (27)$$

$$\approx -2\pi\epsilon\left(-kU(P_0)\left(-\frac{k\epsilon}{4} + i\frac{2}{\pi}\frac{1}{k\epsilon}\right) - \left(1 + i\frac{2}{\pi}\log\left(\frac{k\epsilon}{2}\right)\right)\right),$$

where we have made the approximations $$H_0(k\epsilon) \approx 1 + i\frac{2}{\pi}\log\left(\frac{k\epsilon}{2}\right)$$

$$\frac{\partial}{\partial r}H_0(k\epsilon) \approx -\frac{k\epsilon}{4} + i\frac{2}{\pi}\frac{1}{k\epsilon}.$$

These approximations are valid for ϵ>>1 and the right- and left-hand sides of equation (27) have the same asymptotic behavior in the ϵ→0 limit. However, the ϵ→0 limit of the right-hand side of equation (27) is easily computable, leading to the result $$\lim_{\epsilon\to 0}\left[-\int_{\Gamma_\epsilon} U\frac{\partial G}{\partial n} - G\frac{\partial U}{\partial n} dl\right] = 4iU(P_0).$$

Using this result in (26), we write $$U(P_0) = \frac{1}{4i}\int_{\Gamma} U\frac{\partial G}{\partial n} - G\frac{\partial U}{\partial n}\, dl. \quad (28)$$

Figure 15:
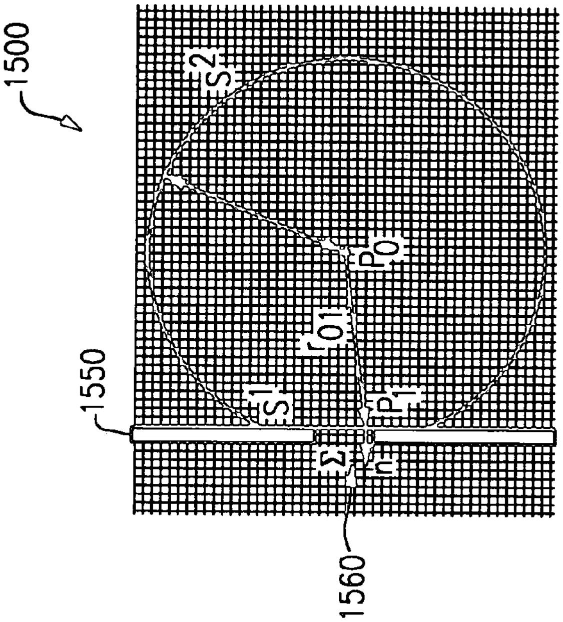
FIG. 15 illustrates at least a portion (region/sub-lattice) of a two dimensional lattice 1500 that emulates diffraction through a screen (barrier) including an aperture.

FIG. 15 illustrates a two dimensional lattice 1500 that emulates diffraction from a screen 1550 including an aperture 1560.

A. Kirchhoff

Consider diffraction in 2D from a screen with aperture Σ as in FIG. 15.

We now use the integral formula of equation (28) to compute $U(P_0)$ with $\Gamma=S^1 \div S^2$. We break the integral over Γ two pieces, i.e., $$U(P_0) = \frac{1}{4i}\int_{S^1} U\frac{\partial G}{\partial n} - G\frac{\partial U}{\partial n}\, dl + \frac{1}{4i}\int_{S^2} U\frac{\partial G}{\partial n} - G\frac{\partial U}{\partial n}\, dl. \quad (29)$$

First let's do the integral over $S^2$ and show that it vanishes.

$$\int_{S^2} U\frac{\partial G}{\partial n} - G\frac{\partial U}{\partial n}\, dl = \int_{S^2} Uk\sqrt{\frac{2}{\pi kR}}\, i\exp[i(kr-\pi/4)] - \sqrt{\frac{2}{\pi kR}}\exp[i(kR-\pi/4)]\frac{\partial U}{\partial n} dl$$

$$= \sqrt{\frac{2}{\pi k}}\int \sqrt{R}\left(ikU - \frac{\partial U}{\partial n}\right)\exp\left[i\left(kR - \frac{\pi}{4}\right)\right]d\theta$$

where we use the following approximations, valid for R>>1

$$G(R) = H_0(kR) \approx \sqrt{\frac{2}{\pi kR}}\exp[i(kR-\pi/4)]$$

$$\frac{\partial G}{\partial R} = k\frac{\partial}{\partial r}H_0(kR) \approx k\sqrt{\frac{2}{\pi kR}}\,i\exp[i(kr-\pi/4)].$$

Therefore, we have the following condition: if, for all θ, $$\lim_{R\to\infty}\left[\sqrt{R}\left(ikU - \frac{\partial U}{\partial n}\right)\right] = 0,$$

then the $S^2$ integral vanishes. This condition is the 2D analogue of the Sommerfeld outgoing radiation condition. Assuming that the condition holds, the only contribution to the integral comes from $S^1$, i.e., the formula of equation (29) reduces to $$U(P_0) = \frac{1}{4i}\int_{s^i} U\frac{\partial G}{\partial n} - G\frac{\partial U}{\partial n}dl.$$

If we now make the Kirchhoff assumptions, then both U and ∂U/∂n are zero everywhere on $S^1$ except inside Σ. Take $P_1 \in \Sigma$ and define $r_{01}$ as the vector from $P_0$ to $P_1$. Here and in what follows, we use $r_{01}$ to denote the magnitude of the vector $r_{01}$. Then $$U(P_0) = \frac{1}{4i}\int_\Sigma U\frac{\partial}{\partial n}H_0(kr_{01}) - H_0(kr_{01})\frac{\partial U}{\partial n}dl.$$

Figure 16:
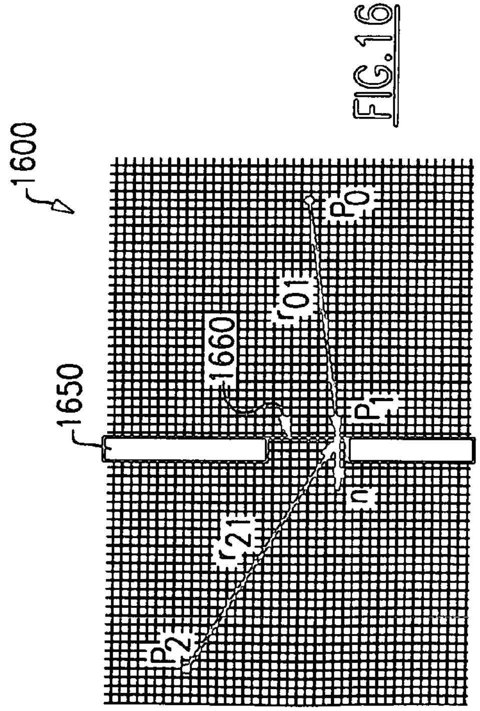
FIG. 16 illustrates at least part of a two dimensional lattice 1600 that emulates diffraction of a point source proximate to a screen (barrier) including an aperture.

FIG. 16 illustrates a two dimensional lattice 1600 that emulates diffraction of a point source proximate to a screen 1650 including an aperture 1660. The Kirchhoff assumptions continue: assume that, inside Σ, both U and ∂U/∂n are the same as if there is no screen. That is to say, assume that $U(P_1)$ is the field due to a radially symmetric point source located at $P_2$ where $P_2$ is a point to the left of the screen, as in FIG. 10. Then, if $r_{21}$ is the vector joining $P_1$ to $P_2$, we have $$U(P_1)=AH_0(kr_{21}).$$

Using this in the above integral yields $$\begin{aligned}U(P_0) &= \frac{1}{4i}\int_\Sigma AH_0(kr_{21})\frac{\partial}{\partial n}H_0(kr_{01}) - H_0(kr_{01})\frac{\partial}{\partial n}AH_0(kr_{21})dl\\ &= \frac{A}{4i}\int_\Sigma H_0(kr_{21})\frac{\partial}{\partial n}H_0(kr_{01})\cos(n, r_{01}) -\\ &\quad H_0(kr_{01})\frac{\partial}{\partial n}H_0(kr_{21})\cos(n, r_{21})dl\\ &= \frac{Ak}{4i}\int_\Sigma -H_0(kr_{21})H_1(kr_{01})\cos(n, r_{01}) +\\ &\quad H_0(kr_{01})H_1(kr_{21})\cos(n, r_{21})dl.\end{aligned}$$

This is the Kirchhoff diffraction integral.

B. Rayleigh-Sommerfeld

There are inconsistencies in the Kirchhoff boundary conditions. If U and ∂U/∂n are both zero everywhere on a part of $S^1$, and if U satisfies the Helmholtz equation in the domain contained by $\Gamma=S^1+S^2$, then one can prove that U must be zero everywhere inside the curve Γ. To remedy this condition, we choose different Green's functions so that we have to enforce only one of the two conditions U=0 or ∂U/∂n=0 on the part of $S^1$ that does include the aperture Σ.

In what follows, $G_-$ will be the Green's function that corresponds to taking ∂U/∂n=0 on $S^1$ not including Σ. We could also evaluate the integral using $G_+$, the Green's function that corresponds to taking U=0 on $S^1$ not including Σ. Using $G_-$ or $G_+$ to deriving, respectively, the first and second Rayleigh-Sommerfeld diffraction integrals. Here we pursue the calculation for $G_-$ only.

Figure 17:
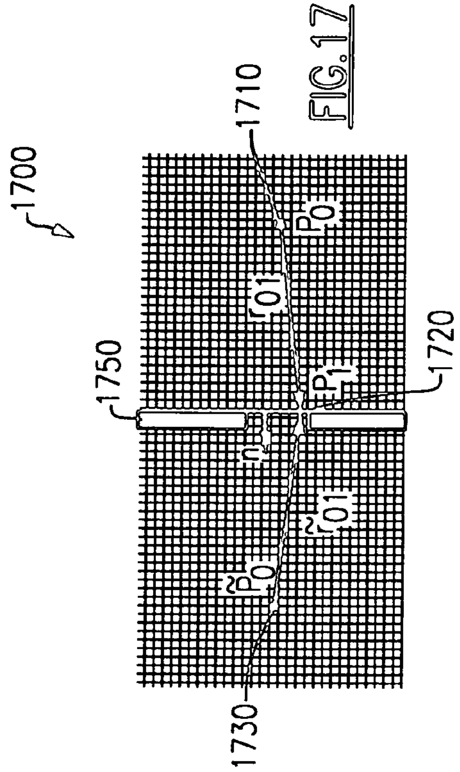
FIG. 17 illustrates at least part of a two dimensional lattice 1700 that supports a discussion of the Sommerfeld Green's function.

FIG. 17 illustrates a portion of a two dimensional lattice 1700 that supports a discussion of the Sommerfeld Green's function. The picture here is that $P_0$ 1710 is a point to the right of the screen, $P_1$ 1720 where $P_1 \in \Sigma$ is a point inside the aperture, and $\overline{P}_0$ 1730 is a point to the left of the screen 1750 that "mirrors" $P_0$ 1710. This means that $r_{01}$ is the reflection of $\hat{r}_{01}$. The outward unit normal n points to the left from Σ, as in FIG. 17.

Using $G_-$ in (28) gives $$U_I(P_0)\frac{1}{4i}\int_\Sigma U\frac{\partial G_-}{\partial n}dl.$$

Note that $$\begin{aligned}\frac{\partial G_-}{\partial n} &= k\frac{\partial}{\partial r}H_0(kr_{01})\cos(n, r_{01}) - k\frac{\partial}{\partial r}H_0(k\bar{r}_{01})\cos(n, \bar{r}_{01})\\ &= -kH_1(kr_{01})\cos(n, r_{01}) + kH_1(k\bar{r}_{01})\cos(n, \bar{r}_{01}).\end{aligned}$$

On Σ, we know that $\cos(n, \hat{r}_{01})=-\cos(n, r_{01})$ and $\tau_{01}=\hat{\tau}_{01}$. Therefore, $$\frac{\partial G_-}{\partial n} = -2k\cos(n, r_{01})H_1(kr_{01}).$$

This implies $$U_I(P_0) = -\frac{k}{2i}\int_\Sigma U\cos(n, r_{01})H_1(kr_{01})dl. \tag{30}$$

This is the 2-D version of the first Rayleigh-Sommerfeld diffraction integral.

We could of course specialize this integral to the case where $P_1$ is illuminated by a radially symmetric point source located at $P_2$, an arbitrary point to the left of the screen. This means that $U(P_1)=AH0(kr_{21})$, which can be substituted into equation (30) to produce $$U_I(P_0) = -\frac{kA}{2i}\int_\Sigma H_0(kr_{21})H_1(kr_{01})\cos(n, r_{01})dl. \tag{31}$$

Let $\lambda = 2\pi/k$.

For $r_{01} \gg \lambda$, $r_{21} \gg \lambda$, we obtain

-continued $$U_I(P_0) = \frac{-kA}{2i}\int_\Sigma\left(\sqrt{\frac{2}{\pi k r_{21}}}\exp[ikr_{21} - i\pi/4]\right)\times \left[\sqrt{\frac{2}{\pi k r_{01}}}\exp[ikr_{01} - i\pi/4]\cdot(-i)\right]\cos(n, r_{01})dl,$$

where the term in parentheses is the large r approximation of $H_0(kr_{21})$ and the term in square brackets is the large r approximation of $H_1(kr_{01})$. Using these approximations, we have $$U_I(P_0) = \frac{A}{\pi}\int_\Sigma \frac{1}{\sqrt{r_{21}r_{01}}}\exp[ik(r_{01}+r_{21})](-i)\cos(n, r_{01})dl.$$

C. Huygens-Fresnel

Figure 18:
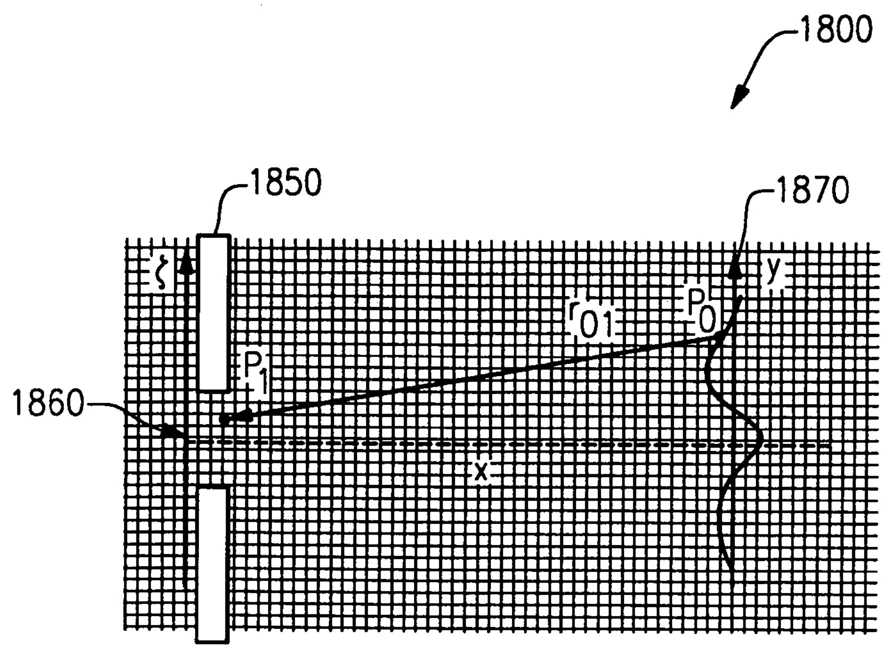
FIG. 18 illustrates at least part of a two dimensional lattice 1800 that emulates of illumination on a line several wavelengths away from a thin slit diffraction aperture.

Our goal here is to determine the illumination onto a plane screen located several wavelengths away from the aperture. For diffraction problems in two spatial dimensions, we do not believe this calculation has appeared previously in the literature. The picture is given in FIG. 18. FIG. 18 illustrates a portion of a two dimensional lattice 1800 that emulates of illumination on a line 1870 several wavelengths away from a barrier 1850 including a thin slit diffraction aperture 1860. We start with the Rayleigh-Sommerfeld diffraction integral of equation (30), which we repeat here:

$$U_I(P_0) = \frac{-k}{2i}\int_\Sigma U\cos(n, r_{01})H_1(kr_{01})dl.$$

Inside the aperture Σ, we have $\cos\theta = x/r_{01}$, which gives $$U_I(y) = -\frac{kx}{2i}\int_\Sigma U(\xi)\frac{H_1(kr_{01})}{r_{01}}d\xi.$$

We use $r_{01}^2 = x^2 + (y-\xi)^2$ and approximate $$r_{01} = x\sqrt{1+\left(\frac{y-\xi}{x}\right)^2} \approx x\left(1+\frac{1}{2}\left(\frac{y-\xi}{x}\right)^2\right) = x + \frac{1}{2}\frac{(y-\xi)^2}{x}.$$

The same approximation strategy gives $$\frac{1}{r_{01}} \approx \frac{1}{x}\frac{1}{1+(y-\xi)^2/(2x^2)} \approx \frac{1}{x}\left(1-\frac{1}{2}\frac{(y-\xi)^2}{x^2}\right) = \frac{1}{x} - \frac{1}{2}\frac{(y-\xi)^2}{x^3}.$$

The difference between the approximations of $r_{01}$ and $r_{01}^{-1}$ is that the $O(y-\xi)^2$ term appears in $r_{02}^{-1}$ with an extra factor of $x^{-2}$. Since x is assumed large compared with the wavelength, we keep the $O(y-\xi)^2$ term only when rol appears in the numerator, and drop it whenever $r_{01}$ appears in the denominator. This gives $$U_I(y) = \frac{-k}{2i}\int_\Sigma U(\xi)H_1\left[kx\left(1+\left(\frac{y-\xi}{x}\right)^2\right)\right]d\xi.$$

Now we use the far-field asymptotics of the Hankel function to approximate $$H_1\left[kx\left(1+\left(\frac{y-\xi}{x}\right)^2\right)\right] \approx \sqrt{\frac{2}{\pi kx\left(1+\left(\frac{y-\xi}{x}\right)^2\right)}}\exp\left[i\left(kx+\frac{k}{x}(y-\xi)^2-\pi/4\right)\right] \approx \sqrt{\frac{2}{\pi}}\frac{e^{ikx}}{\sqrt{xk}}\exp\left[\frac{ik}{x}(y-\xi)^2 - i\pi/4\right].$$

Inserting this approximation into the integral we have $$\begin{aligned} U_I(y) &\approx -\frac{k}{2i}\sqrt{\frac{2}{\pi}}\frac{e^{ikx}e^{-i\pi/4}}{\sqrt{kx}}\int_\Sigma U(\xi)\exp\left[\frac{ik}{x}(y-\xi)^2\right]d\xi \\ &= -\frac{e^{i\pi/4}\sqrt{2}}{2i\sqrt{\pi}}\sqrt{k}\frac{e^{ikx}}{\sqrt{x}}\int_\Sigma U(\xi)\exp\left[\frac{ik}{x}(y^2-2y\xi+\xi^2)\right]d\xi \\ &= C\sqrt{k}\frac{e^{ikx}}{\sqrt{x}}e^{\frac{ik}{x}y^2}\int_{-\infty}^{+\infty}\left\{U(\xi)e^{\frac{ik}{x}\xi^2}\right\}e^{-\left(\frac{2ik}{x}\right)y\xi}d\xi, \end{aligned} \tag{32}$$

where U(ξ)=0 when ξ∉Σ, and where the constand C is given by $$C = -\frac{e^{i\pi/4}\sqrt{2}}{2i\sqrt{\pi}}.$$

Note that this last integral of equation (32) is the Fourier integral with phase shift. If we can design a lens that cancels out the phase shift $$e^{\frac{ik}{x}\xi^2},$$

then we have designed a 2-D LC lattice that takes the spatial Fourier transform of an input signal.

Figure 19:
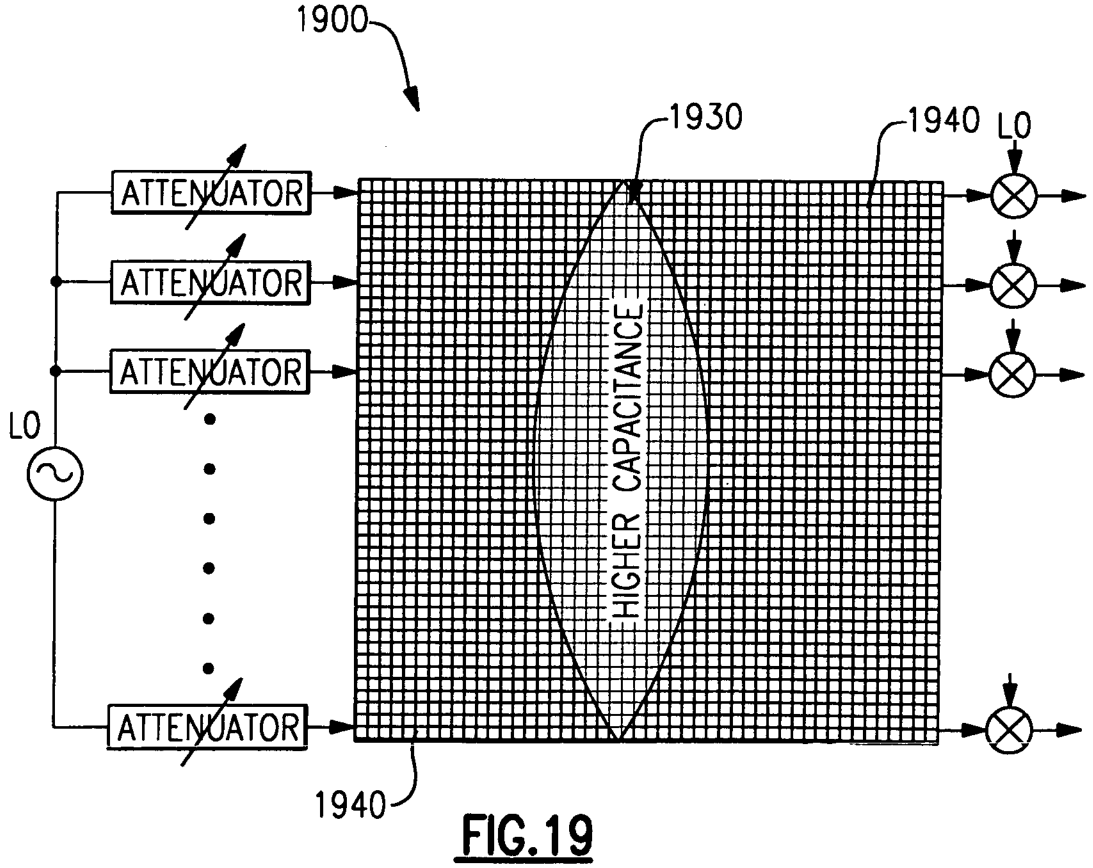
FIG. 19 illustrates a two dimensional lattice 1900 comprising a first portion (region/sub-lattice) configured to have a shape of a lens and a second portion (region/sub-lattice) configured to have a shape of a space surrounding the lens.

FIG. 19 illustrates a two dimensional lattice 1900 comprising a first portion (region/sub-lattice) 1930 configured to have a shape of a lens and a second portion (region/sub-lattice) 1940 configured to have a shape of a space surrounding the lens.

It is feasible to make this lattice on a semiconductor substrate. Here we assume a Silicon substrate that is more popular in today's silicon technology. We use pieces of metal as our inductor and metal-to-metal capacitance as the capacitor.

From the lattice dispersion relation of equation (4), we know that in order to maximize the lattice cutoff frequency, we need to minimize the values of inductors and capacitors in each section. However, we cannot arbitrarily shrink the capacitances of each section, because at some point, parasitic capacitance becomes comparable with our lumped capacitance. In today's typical silicon processes, we can have inductances as low as 30 pH and capacitances as small as 5 fF before the parasitic factors become an issue. The quality factor for these elements is around 20, giving us a lattice cut-off frequency of around 300 GHz.

One important issue is ohmic loss of the silicon substrate. To address this problem, we need to use a ground plane beneath our inductors to shield the silicon substrate. By adding this layer, we could achieve higher quality factors in our inductors. To find the exact value of inductance and capacitance as well as loss in each section, we use an E/M simulator such as Ansoft HFSS (available from the Ansoft Corporation, having a place of business at 225 West Station Square Drive, Suite 200, Pittsburgh, Pa. 15219).

Another issue that has an effect on the performance of the structure is magnetic coupling of the inductors. Adjacent inductors induce current in each other; to model this accurately requires additional terms in our circuit model of equations (2a-2c). Fortunately, with typical values of inductors and capacitors, this mutual inductance is not that large: a careful E/M simulation shows that the coupling coefficient of adjacent inductors is less than 0.1. In our numerical analysis, we take this effect into account, but because of complexity we neglected this effect in our mathematical analysis.

Using the exact circuit models, we have simulated this structure and are in the process of fabricating the Fourier transform circuit in a SiGe BiCMOS process.

FIG. 19 shows the architecture of the circuit, with a lens-shaped portion (section/region) 1930 in the interior designed to cancel out the phase shift in the Huygens-Fresnel integral of equation (32).

Figure 20:
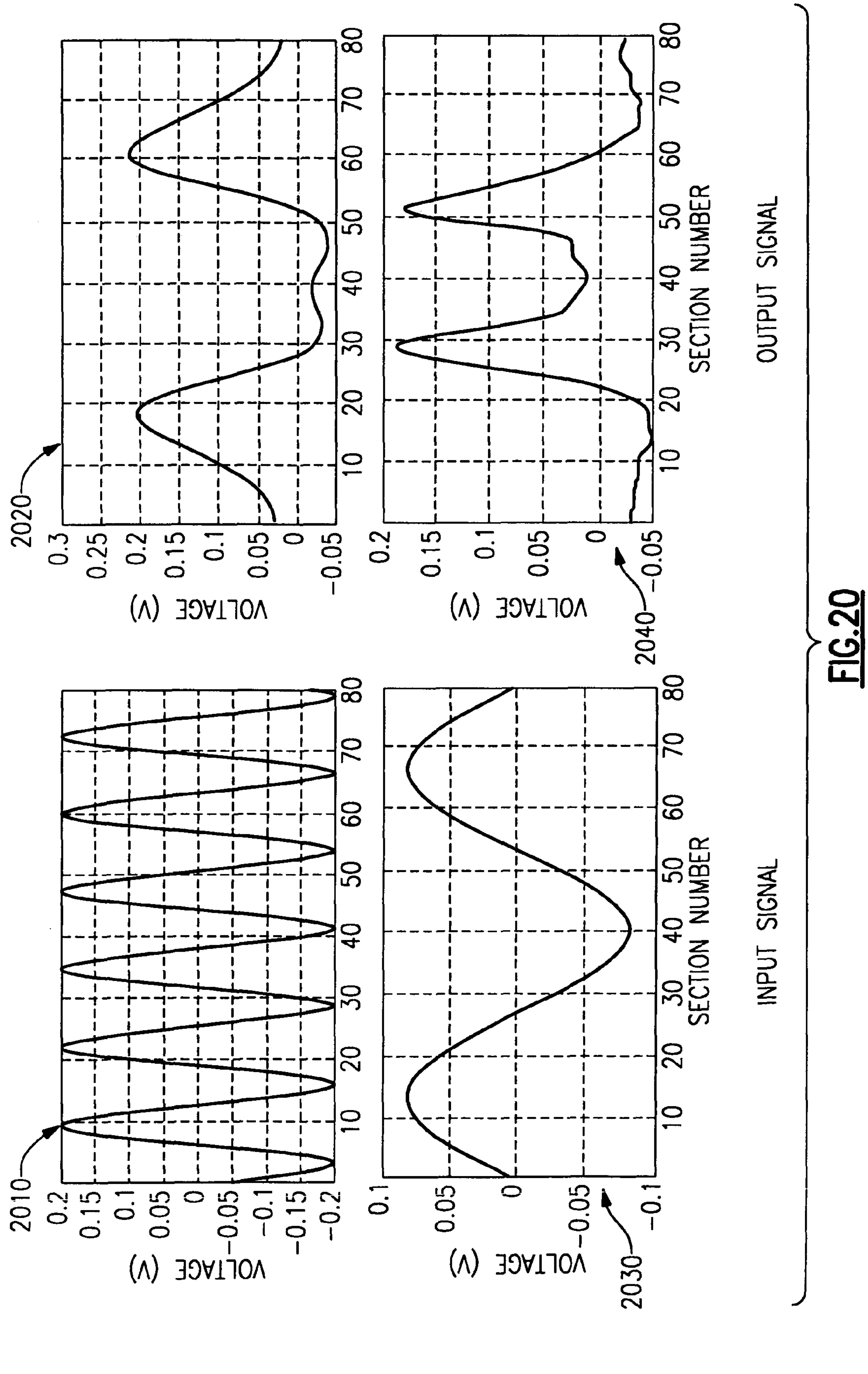
FIG. 20 illustrates the results of an emulation employing a two dimensional lattice to effect a spatial one dimensional Fourier transformation of an input signal.

The following describes subject matter related to a Fourier transform. FIG. 20 illustrates the results of an emulation employing a two dimensional lattice 110 to effect a spatial one dimensional Fourier transformation of an input signal 2010, 2030. This illustrates the results for two different numerical simulations of the 2-D LC lattice showing how diffraction and lensing effects combine to effectively take the spatial 1-D Fourier transform of the input signal 2010, 2030. The plots on the left (input signals) 2010, 2030 correspond to two different choices of $p_j$ in the expression of equation (33), with w=60 GHz. Lattice parameters are L=30 pH and C 20 fF, except in a lens-shaped region in the center of the lattice where L is unchanged but C 60 fF. For each input signal 2010, 2030 such a lattice was simulated, and the plots on the right 2020, 2040 show $V_{100,j}(t)$ as a function of vertical section number j, for a particular instant of time t>0.

Direct numerical simulations show quite clearly the Fourier transform capabilities of the 2-D LC lattice. By this we mean that if the forcing of the lattice's left boundary is given by $$V_{1,j}(t)=p_j \sin(2\pi\omega t), \tag{33}$$

then the signal at the right boundary will consist of an approximate, discrete Fourier transform of the spatial part p of the input signal. In what follows, all reported numerical results arise from solving Kirchoff's laws of equations (2a-2c) for 80×100 lattices, subject to the boundary conditions described for dispersive correction.

FIG. 20 shows the Fourier transform of two sinusoid input signals 2010, 2030 with two different spatial wavelengths.

The lattice parameters are nearly the same as before for FIG. 13 namely, outside the lens-shaped region 1930 shown in FIG. 19, we take L=30 pH, C=20 fF, and w=60 GHz. Inside the lens-shaped region 1930, we leave L unchanged but take C=60 fF. The lattice has 80 nodes in the vertical direction and 100 nodes in the horizontal direction. We force the left boundary with a sinusoidal forcing function of the form of equation (25), and examine the output at the right boundary.

To ensure that the simulations are realistic, we add two effects not present in our mathematical analysis above. Namely, we add a mutual inductance term that takes into account coupling of adjacent inductors. As mentioned above, the coupling coefficient for this term is very small compared with unity (0.1), and the effect is not large. Furthermore, we assume each section as a resistance of 0.1Ω, and that all inductors and capacitors vary randomly by about 5% from the values reported above.

The output 2020, 2040 of the circuit shows clearly two peaks, as expected. Furthermore, the sinusoid with smaller wavelength (and therefore higher wave number) yields two peaks that are more widely separated than those generated by the sinusoid with larger wavelength (and therefore smaller wave number). Because the aperture of the lens is comparable with the wavelength of the input signal, diffractive effects are quite important. The output 2020, 2040 is not simply a focused version of the input 2010, 2030, but a focused and diffracted version of the input 2020, 2040. Comparing FIG. 13 and FIG. 20, it is now clear that the lens brings into focus the blurry Fourier transform that results from diffraction alone.

Finally, FIG. 20 clearly shows the DC value of the input. The first waveform has a lower average value compared to the second one and we can clearly see this difference in our output waveform 2020, 2040.

Figure 21:
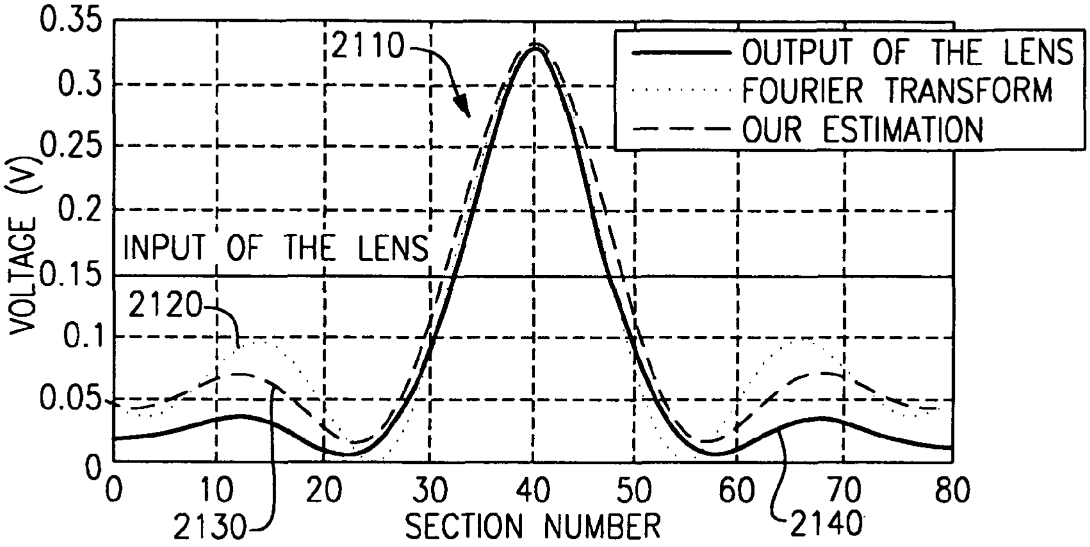
FIG. 21 illustrates the results of an emulation employing the lattice of FIG. 20 using an input signal that is a step function.

The following describes subject matter related to a step input signal. FIG. 21 illustrates the results of an emulation employing the lattice of FIG. 20 using an input signal that is a step function. This illustrates a numerical simulation of the 2-D LC lattice (solid line) 2140 as compared with our analytical prediction (dashed line) 2130 and the true Fourier transform (dotted line) 2120 of the input given by equation (34), with w=60 GHz. Lattice parameters are unchanged from FIG. 20. The (black) solid line curve 2140 shows the numerically computed values of $V_{100,j}(t)$ as a function of vertical section number j, for a particular instant of time t>0.

Next we consider precisely the same lattice of FIG. 20, changing the boundary forcing to be equal to a step function, namely, $$V_{1,j}(t)=0.15 \sin(2\pi\omega t). \tag{34}$$

The output signal is shown in FIG. 21.

The Fourier transform of the step input is a sin c function 2110, shown by the dotted line (green) curve 2120. Our mathematical analysis predicts that the output signal should be given by the dashed line (blue) curve 2130, while the numerical simulation itself yielded the solid line (black) curve 2140.

The three curves 2120-2140 are qualitatively the same except in the tails, where there is some discernible disagreement. In the tails, one finds that our analysis (estimation) is closer to the numerical simulation (output of the lens) than the true Fourier transform. The error in the tails is due to two factors: (1) due to boundary effects, the finite lattice is not exactly the same as a thin slit diffraction problem, though it features qualitatively identical physics, and (2) the lens-shaped region in 1930 the middle of the 2-D LC lattice is not quite a "thin lens," meaning that the paraxial approximation is not quite valid. Some of the phase shift from the original Huygens-Fresnel diffraction integral is not quite cancelled out in the tails.

Figure 22:
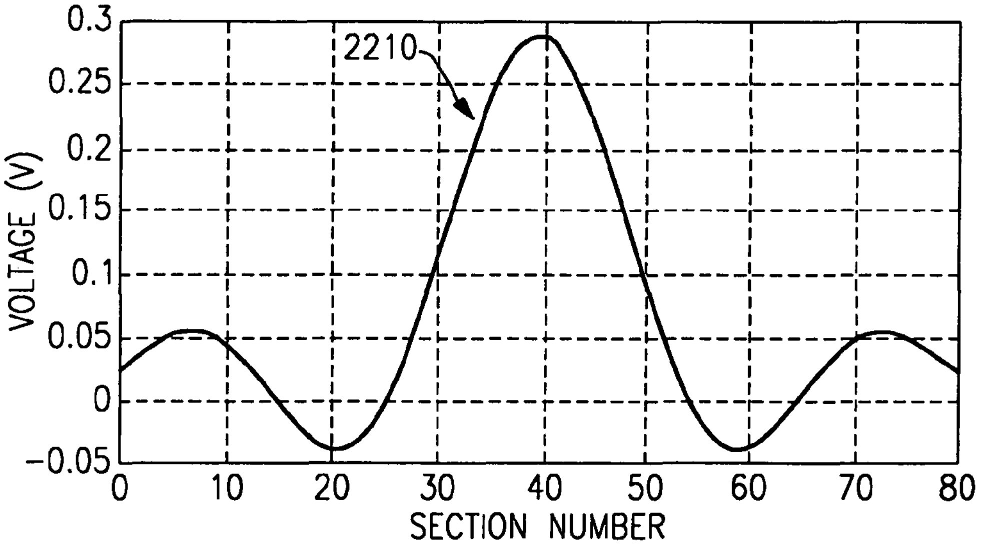
FIG. 22 illustrates a graph of voltage of a sin c input signal as a function of a location within a two dimensional lattice.
Figure 23:
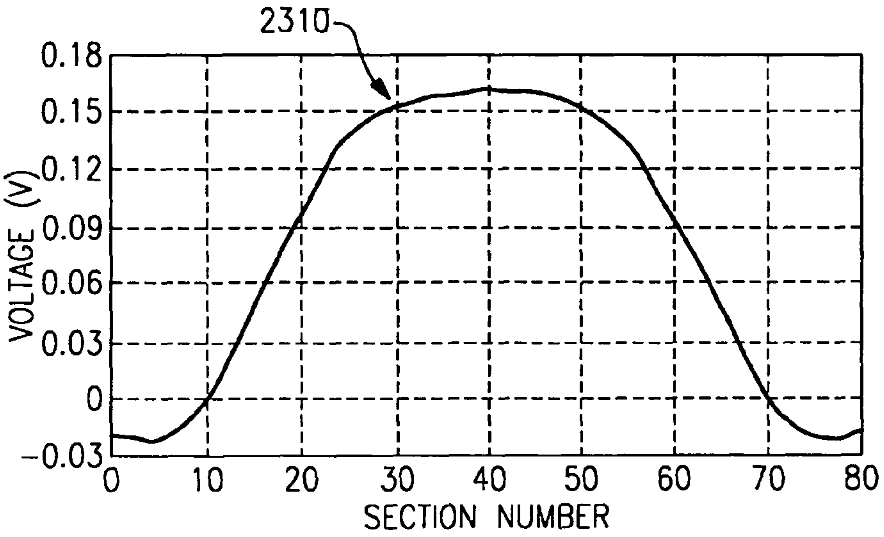
FIG. 23 illustrates a graph of voltage of an output signal resulting from the transformation of the input signal of FIG. 22.

The following describes subject matter related to a sin c input signal. FIG. 22 illustrates a graph of a sinc input signal 2210 with respect to its voltage at an input location within a two dimensional lattice. The input signal 2210 is shown in FIG. 22, and the output signal 2310 is shown in FIG. 23. The sin c input signal 2210 is for the 2-D LC lattice, corresponding to equation (35) with w=60 GHz. The input $V_{i,j}(t)$ is plotted versus vertical section number j at a fixed instant of time t.

Finally we consider the same lattice again but with input equal to a sinc function:

$$V_{1,j}(t)=0.3 \sin c(\beta_j)\sin(2\pi\omega t). \tag{35}$$

The output is roughly symmetric, and roughly constant between section numbers (elements) 28 and 52. The true discrete Fourier transform, limited to a particular band of wave numbers, would be perfectly symmetric and have much steeper rise and fall sections than the curve shown in FIG. 23. However, given that we included just over two full cycles of the sine function 2210 as input, the output 2310 is quite reasonable.

FIG. 23 illustrates a graph of voltage of an output signal 2310 resulting from the transformation of the input signal of FIG. 22. This illustrates simulated output 2310 $V_{100,j}(t)$ at a fixed instant of time t>0, plotted versus vertical section number j. The input that generated this output is given by equation (35) and FIG. 22. Lattice parameters are unchanged from FIG. 20.

As described, numerical simulations indicate that 2-D LC lattices can be used to refract and diffract incoming waves of voltage. For waves with wavelength sufficiently large that only a few wavelengths are able to fit into a finite lattice, the lattice acts as a thin-slit diffraction aperture. By combining the lensing (refractive) and diffractive effects, we have demonstrated how a 2-D LC lattice can be used as a Fourier transform device.

These numerical findings were matched by the mathematical analysis of the refraction and diffraction problems for 2-D waves. In the case of diffraction, it was found that a thin-slit aperture yields a phase-shifted Fourier transform, by way of the Huygens-Fresnel integral of equation (32). Canceling out this phase shift using a lens is precisely what the circuit shown in FIG. 19 is designed to do. Should we wish to do so, high-frequency lenses can be designed in 2-D LC media quite accurately using the dispersively corrected Snell's law that we derived.

Simulations (emulations) indicate that even in the presence of loss, mutual inductance, and capacitor/inductor variations, a 2-D LC lattice still manages to obtain discrete Fourier coefficients from the input signal. Furthermore, these Fourier coefficients match the true Fourier transform quite well in a qualitative sense.

Such a Fourier transform device has some interesting properties. First off, the throughput of the lattice could be extremely high. To see this, note that one does not need an input signal to propagate all the way from the left boundary to the right boundary of the lattice before injecting a new, different input signal. In other words, inputs could be stacked in time, and multiple Fourier transforms could be computed without waiting. Preliminary simulations indicate that the throughput of the lattice could be as fast as 10 Gbits/sec.

Second, though it may not be important for certain applications, latency of the lattice is quite low: around 10 psec. The latency is computed simply by multiplying the characteristic signal propagation delay of the lattice, τ, by the number of sections in the horizontal direction. This implies, moreover, that the latency is independent of the carrier frequency w.

The lattice erases the delay of digital gates, but not of sampling speed. Sampling is still required to read the output signal and pick up the Fourier coefficients. This and other implementation issues are currently being investigated and in future work, we hope to report measurement and test data for a Fourier transform device based on a 2-D LC lattice, fabricated on chip.

Figure 24:
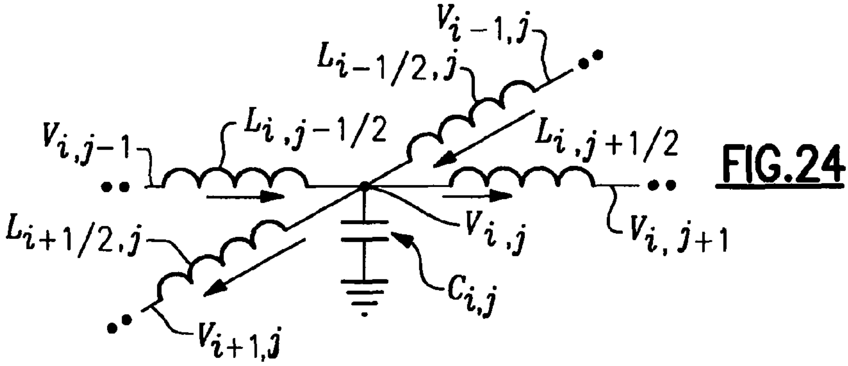
FIG. 24 illustrates electrical components surrounding a node of a two dimensional lattice like that of FIG. 1.

FIG. 24 illustrates electrical components surrounding a node 2406 of a two dimensional lattice like that of FIG. 1. The lattice node 2406 is located in between inductors 2402*a* and 2402*d* that are located along an electrical path parallel to the X axis 120 and is located in between inductors 2402*b* and 2402*c* that are located along an electrical path parallel to the Y axis 130. A capacitor 2404*a* is also electrically connected to the node 2406. The voltage at node 2410 is represented by Vij.

For the rectangular case, Kirchoff's laws yield the semi-discrete system:

$$I_{i,j-1/2}+I_{i-1/2,j}-I_{i+1/2,j}-I_{i,j+1/2}=c_{ij}\frac{dV_{ij}}{dt} \tag{35a}$$

$$V_{ij}-V_{i,j-1}=l_{i,j-1/2}\frac{d}{dt}I_{i,j-1/2} \tag{35b}$$

$$V_{ij}-V_{i+1,j}=l_{i+1/2,j}\frac{d}{dt}I_{i+1/2,j} \tag{35c}$$

Differentiating (1a) with respect to time, we substitute equations (35a-35b), yielding in an ordinary differential equation (ODE). Starting from this semi-discrete model, we develop the continuum model in the standard way. Assuming the nodes are equispaced in the X 120 and Y 130 directions, we could define parameter h to be the spacing between two adjacent nodes. We Taylor expand the voltage to second order in h, we will have:

$$\nabla^2V-LCV_{tt}=\frac{\nabla V\cdot\nabla L}{L}-h^2\left[\frac{1}{12}(V_{xxxx}+V_{yyyy})-\frac{1}{6}\frac{L_xV_{xxx}+L_yV_{yyy}}{L}-\frac{1}{4}\frac{L_x^2V_{yy}+L_y^2V_{xx}}{L^2}\right]$$

Here L and C are inductance and capacitance per unit length. Considering small sinusoidal perturbations about a constant voltage $V_0$, we could find the dispersion relation from this equation. Dispersion is due to the discrete nature of the line and will be present in all discrete lattices. We solved this equation numerically using MATLAB for an arbitrary L and C functions.

To find an analytical solution, we will now consider an extremely large lattice, i.e., the case when number of sections in X 120 and Y 130 direction (M and N, respectively) are both very large. In this case, we may ignore the $h^2$ terms and use equation (36) as our governing equation:

$$\nabla^2V-LCV_{tt}=\frac{\nabla V\cdot\nabla L}{L} \tag{36}$$

The transmission lattice is at rest (no voltage, no current) at t=0, at which point a sinusoidal voltage source with amplitude A and frequency a is switched on at the left boundary. We assume that the transmission lattice is long in the X 120 direction, and that it is terminated at its (physical) right boundary in such a way that the reflection coefficients there are very small. Hence we model the transmission lattice as semi-infinite in the x coordinate, but bounded in the y coordinate by the lines y=−1 and y=+1. As we have shown in the publication titled "Extremely Wideband Signal Shaping using one and two Dimensional Non-uniform Nonlinear Transmission Lines," Journal of Applied Physics, (2006), for the case of funnel (constant LC product) the solution of this initial-boundary-value problem could be written as:

$$V(x,y,t)=\frac{-A_{\kappa_2}(y)}{\kappa_3(y)x+\kappa_2(y)}\sin\left[\frac{\alpha}{v_0}(x-v_0t)\right]$$

Where $k_2$ and $k_3$ should satisfy:

$$L(x, y) = 4(\kappa_3(y)x + \kappa_2(y))^{-2}$$

$$\kappa_3 = \frac{\kappa_2}{\kappa_{2yy}\kappa_{3yy}}$$

By proper choosing of $k_2$ and $k_3$ one could build any desired function for L and find the voltage anywhere in the lattice. For the case of ideal funnel, this solution confirms our simulation results. The following describes subject matter related to power gain calculations.

Figure 25:
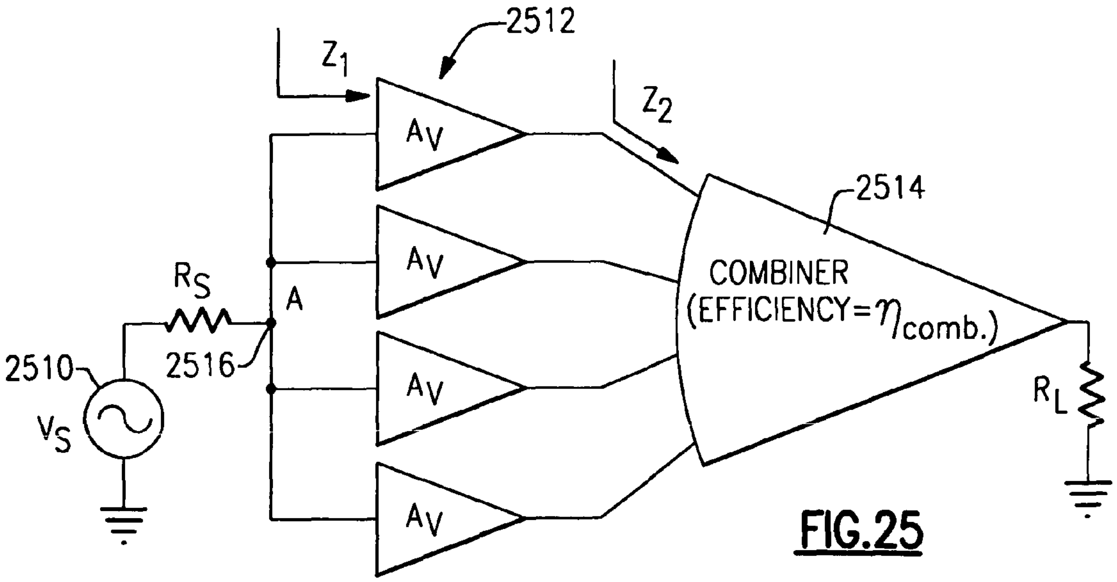
FIG. 25 illustrates a particular embodiment of a chip architecture including a plurality of amplifiers and a signal combiner.

FIG. 25 illustrates a particular embodiment of a chip architecture including a plurality of amplifiers 2512 and a signal combiner 2514. Assume that the voltage at node A 2516 is $V_{in}$, then we could write input and output power as:

$$P_{in} = n \cdot \frac{v_{in}^2}{2Z_1}$$

$$P_{out} = n \cdot \frac{A_v^2 v_{in}^2}{2Z_2} \cdot \eta_{comb.}$$

$$G = \frac{P_{out}}{P_{in}} = A_v^2 \cdot \eta_{comb.} \cdot \frac{Z_1}{Z_2}$$

where $Z_1$ and $Z_2$ are input and output impedance of each amplifier, A, is its voltage gain, n is the number of amplifiers, $\eta_{comb}$. is the combining efficiency, and G is the power gain for our amplifier, with $A_v$~1.8, $\eta_{comb.}$~0.7, and $Z_1$ $4Z_2$ the power gain in 84 GHz should be around 9 dB, which is close to our measured value of 8 dB. The following describes subject matter related to a measurement setup.

Figure 26:
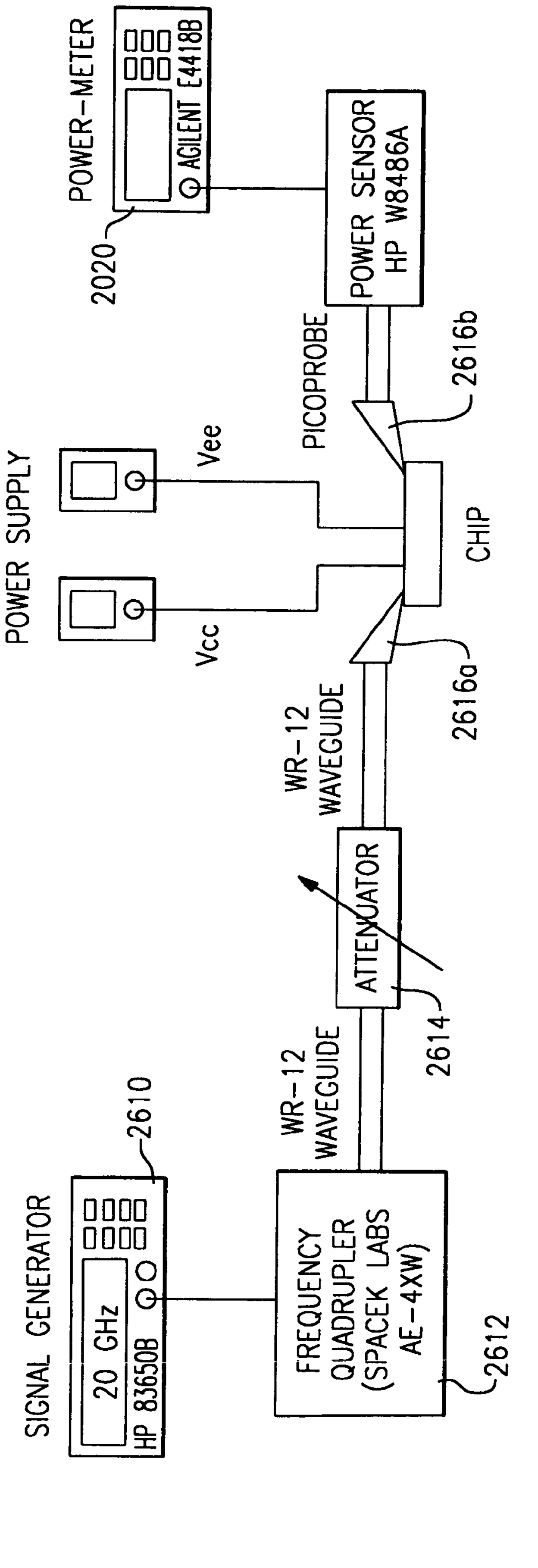
FIG. 26 illustrates an arrangement of equipment for measurement setup of the chip of FIG. 25.

FIG. 26 illustrates an arrangement of equipment for measurement setup of the chip of FIG. 25. The chip is mounted on a brass substrate which is connected to ground. The input is provided by an HP 83650B signal generator 2610 and a Spacek frequency multiplier 2612 which could generate power from 60 GHz to 90 GHz. To be able to control input power, a variable attenuation 2614 is used before the RF probes 2616*a*-2616*b*. We probe input and output of our amplifier and measure the output power using a power-meter 2020.

Because the chip has two supplies (−2.5V and 0.8V), we can't directly connect the chip substrate (which is at −2.5V) to the brass. On the other hand it is critical to have a good heat sink for our chip. To solve this problem we use a thin low-cost CVD diamond between our chip and brass. Diamond is a superior electrical insulator and is the best isotropic thermal conductor with thermal conductivity of around 10 W/cm/° K.

Figure 27:
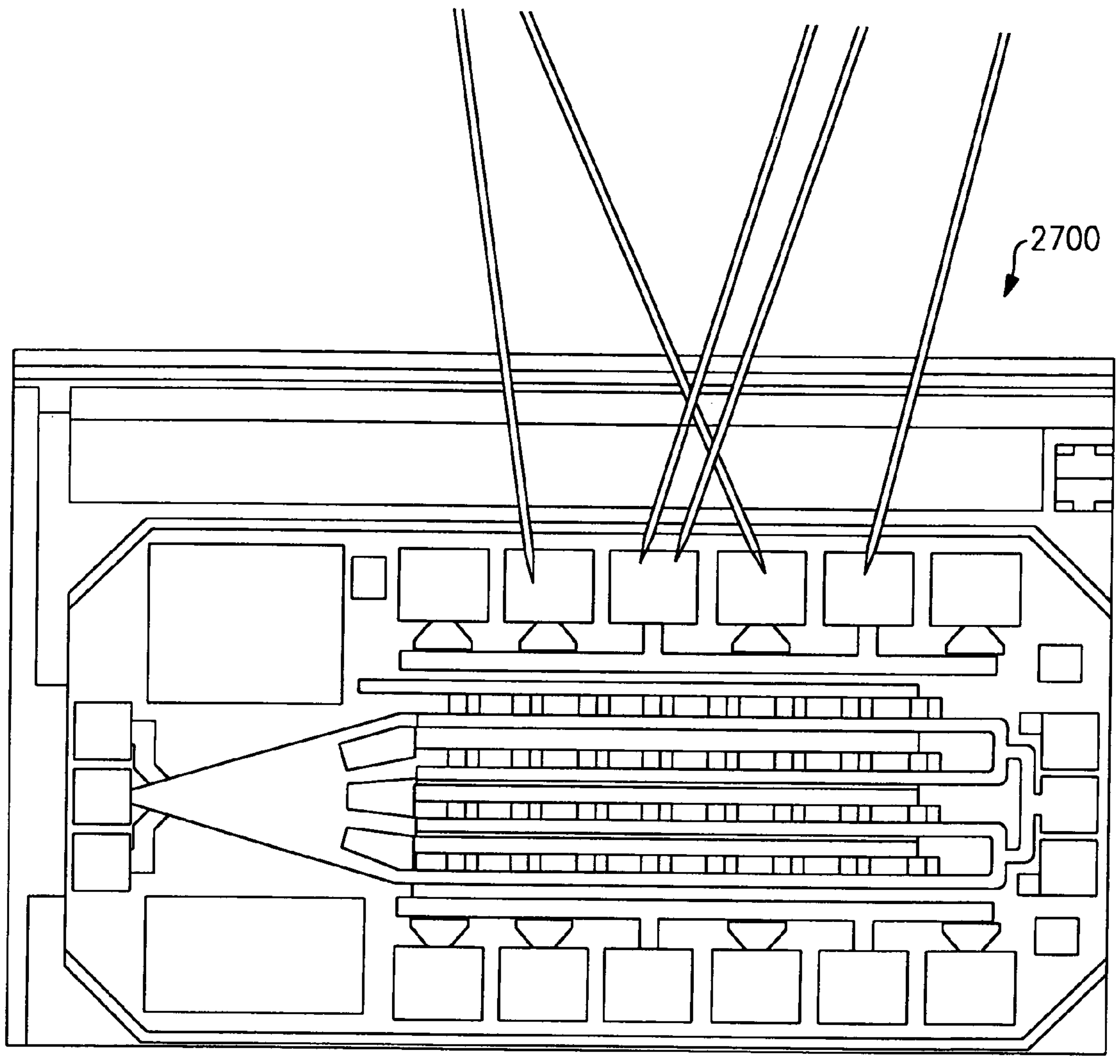
FIG. 27 illustrates a chip that embodies the invention under the test.

FIG. 27 illustrates the chip 2700 under the test. A comparison of the present power amplifier with previous work on mm-wave power amplifiers (mostly in silicon) is summarized in Table (1).

Table 1

| Comparison | | | | | |
|---|---|---|---|---|---|
| Freq. | Device | Pout (dBm) | $PAE_{max}$ (%) | Gain (dB) | Ref |
| 85 GHz | 0.12 μm SiGe | 20.8 | 4 | 8 | This work |
| 77 GHz | 0.12 μm SiGe | 10 | 3.5 | 6.1 | [8] |
| 60 GHz | 0.12 μm SiGe | 16 | 4.3 | 10.8 | [9] |
| 90 GHz | 0.12 μm GaAs pHEMPT | 21 | 8 | 19 | [10] |

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. An electrical signal transformation device, comprising:

a planar two dimensional lattice having a first plurality of electrical paths comprising a first plurality of electrical components that are arranged along a first direction in a plane and a second plurality of electrical paths comprising a second plurality of electrical components that are arranged along a second direction in said plane, each of said first and second pluralities of electrical components having a first electrical terminal and a second electrical terminal;

each electrical component of said first plurality of electrical components having at least one of said first and second electrical terminals connected to at least one of said first and said second electrical terminals of at least one electrical component of said second plurality of electrical components;

a third plurality of electrical components having first and second electrical terminals that are electrically connected between at least some of said first and second electrical terminals of said first and second pluralities of electrical components and a reference voltage source;

at least two input signal nodes and at least one output signal node selected from said first and second electrical terminals of said first plurality of electrical elements, said at least two input signal nodes configured to accept input signals representative of a physical phenomenon that is not electrical in nature and said at least one output signal node configured to provide at least one output computed signal representative of an emulation or a transformation of said physical phenomenon.

2. The electrical signal transformation device of claim 1, wherein said first plurality of electrical components are inductors having substantially the same inductance, said second plurality of electrical components are inductors having inductances at least some of which differ from each other, and said third plurality of electrical components are capacitors having capacitances.

3. The electrical signal transformation device of claim 1, wherein said first, second and third pluralities of electrical components are configured for said emulation of said physical phenomenon using at least one real time analog input signal.

4. The electrical signal transformation device of claim 3, wherein said physical phenomenon is an optical refraction phenomenon.

5. The electrical signal transformation device of claim 1, wherein said planar two dimensional lattice comprises a plurality of planar two dimensional sub-lattices, each of said planar two dimensional sub-lattices comprising a distinct planar two dimensional lattice having a respective first subset of said first plurality of electrical components and said third plurality of electrical components selected to provide at least one of a constant signal propagation velocity and a constant signal propagation amplitude for signals propagating along paths of said first plurality of electrical paths; and a respective first subset of said second plurality of electrical components and said third plurality of electrical components selected to provide at least one of a signal propagation velocity that varies for signals propagating along paths of said second plurality of electrical paths and a signal propagation amplitude that varies for signals propagating along paths of said second plurality of electrical paths.

6. The electrical signal transformation device of claim 5, wherein a first planar two dimensional sub-lattice is configured to emulate a first optical material having a first refractive index and a second planar two dimensional sub-lattice is configured to emulate a second optical material having a second refractive index.

7. The electrical signal transformation device of claim 1, wherein said first plurality of electrical components are capacitors having substantially the same capacitance, said second plurality of electrical components are capacitors having capacitances that vary, and said third plurality of electrical components are inductors having inductances.

8. The electrical signal transformation device of claim 1, wherein said first, second and third pluralities of electrical components are configured to perform said emulation of said physical phenomenon using a Fourier transform.

9. A method of transforming a signal, comprising the steps of:

providing an electrical signal transformation device, comprising:

a two dimensional lattice having a first plurality of electrical paths comprising a first plurality of electrical components that are arranged along a first direction in a plane and a second plurality of electrical paths comprising a second plurality of electrical components that are arranged along a second direction in said plane;

each of said first and second pluralities of electrical components having a first electrical terminal and a second electrical terminal, each electrical component of said first plurality of electrical components having at least one of said first and second electrical terminal connected to at least one of said first and said second electrical terminals of at least one electrical component of said second plurality of electrical components;

a third plurality of electrical components having first and second electrical terminals, said third plurality of electrical components electrically connected between at least some of said first and second electrical terminals of said first and second pluralities of electrical components and a reference voltage source; and at least two input signal nodes and at least one output signal node selected from said first and second electrical terminals of said first plurality of electrical elements, said at least two input signal nodes configured to accept input signals representative of a physical phenomenon that is not electrical in nature and said at least one output signal node configured to provide at least one computed output signal representative of an emulation or a transformation of said physical phenomenon;

providing a first plurality of input signals to said at least two input signal nodes; and observing at said at least one output signal node at least one computed output signal corresponding to an emulation or a transformation of said first plurality of input signals.

10. The method of transforming a signal of claim 9, wherein a second plurality of input signals are provided to said at least two input signal nodes at a time after the step of providing a first plurality of input signals to said at least two input signal nodes, and before the step of observing at least one output signal at said at least one output signal node, said at least one output signal corresponding to a transformation of said first plurality of input signals.

11. The method of transforming a signal of claim 9, wherein said first plurality of input signals are analog input signals.

12. The method of transforming a signal of claim 9, wherein a time interval between the step of providing a first plurality of input signals to said at least two input signal nodes and the step of observing at least one output signal at said at least one output signal node, said at least one output signal corresponding to a transformation of said first plurality of input signals is a propagation time of an analog signal through said electrical signal transformation device.

13. The method of transforming a signal of claim 9, wherein said first plurality of input signals comprise sinusoids.

14. The method of transforming a signal of claim 9, wherein said first plurality of input signals comprise exponential components.

15. The method of transforming a signal of claim 9, wherein said first plurality of input signals comprise complex components.

16. The method of transforming a signal of claim 9, wherein said first plurality of input signals comprise a plurality of substantially the same input signal.

17. The method of transforming a signal of claim 9, wherein said first plurality of input signals comprise at least two different input signals.

18. The method of transforming a signal of claim 9, wherein said emulation or said transformation of said first plurality of input signals is performed using a Fourier transform.

* * * * *